US012795805B2

(12) United States Patent
Smith et al.

(10) Patent No.: US 12,795,805 B2
(45) Date of Patent: Nov. 10, 2026

(54) INDUCTIVELY COUPLED PLASMA LIGHT SOURCE WITH DIRECT GAS INJECTION

(71) Applicants: Hamamatsu Photonics K.K., Shizuoka (JP); Energetiq Technology, Inc., Wilmington, MA (US)

(72) Inventors: Donald K. Smith, Newton, MA (US); Stephen F. Horne, Medford, MA (US); Michael J. Roderick, Everett, MA (US); Kosuke Saito, Hamamatsu (JP); Wolfram Neff, Woburn, MA (US)

(73) Assignees: Hamamatsu Photonics K.K., Shizuoka (JP); Energetiq Technology, Inc., Wilmington, MA (US)

( * ) Notice: Subject to any disclaimer, the term of this patent is extended or adjusted under 35 U.S.C. 154(b) by 916 days.

(21) Appl. No.: 18/077,270

(22) Filed: Dec. 8, 2022

(65) Prior Publication Data

US 2024/0194454 A1 Jun. 13, 2024

(51) Int. Cl.

| | |
|---|---|
| ***H05G 2/00*** | (2006.01) |
| ***H01J 37/24*** | (2006.01) |
| ***H01J 37/32*** | (2006.01) |

(52) U.S. Cl.

CPC ........... *H05G 2/002* (2024.08); *H01J 37/241* (2013.01); *H01J 37/32449* (2013.01); *H01J 37/32623* (2013.01); *H01J 37/32834* (2013.01)

(58) Field of Classification Search

CPC ........... H01J 37/32834; H01J 37/32623; H01J 37/32449; H01J 37/241; H05G 2/002

See application file for complete search history.

(56) References Cited

U.S. PATENT DOCUMENTS

| | | | |
|---|---|---|---|
| 3,054,921 | A | 9/1962 | Lye |
| 3,227,923 | A | 1/1966 | Marrison |

(Continued)

FOREIGN PATENT DOCUMENTS

| | | | |
|---|---|---|---|
| CN | 1509419 | A | 6/2004 |
| CN | 101770930 | A | 7/2010 |

(Continued)

OTHER PUBLICATIONS

US 8,471,227 B2, 06/2013, Kakizaki (withdrawn)

(Continued)

*Primary Examiner* — Patrick C Chen

(74) *Attorney, Agent, or Firm* — Rauschenbach Patent Law Group, PLLC; Kurt Rauschenbach

(57) ABSTRACT

An ultraviolet light source with direct feed gas injection includes a chamber comprising a plasma confinement region and defining an aperture adjacent to the plasma confinement region that passes light generated by the plasma. A magnetic core is positioned around the plasma confinement region and is configured to generate a plurality of plasma current loops that converges in the plasma confinement region during operation. A feed gas injector is coupled to a gas port in the chamber and has an output that is positioned proximate to a boundary of the plasma confinement region so that the feed gas injector provides a feed gas to the plasma confinement region that creates a differential pressure in the plasma confinement region. A high voltage region is coupled to the plasma confinement region. An exhaust port is configured to be coupled to a pump that controls a pressure in the chamber.

29 Claims, 6 Drawing Sheets

(56) References Cited

U.S. PATENT DOCUMENTS

| | | | |
|---|---|---|---|
| 3,418,507 | A | 12/1968 | Young |
| 3,427,564 | A | 2/1969 | Okaya |
| 3,454,921 | A | 7/1969 | Coleman et al. |
| 3,495,118 | A | 2/1970 | Richter |
| 3,502,929 | A | 3/1970 | Richter |
| 3,582,822 | A | 6/1971 | Kamey |
| 3,619,588 | A | 11/1971 | Chambers |
| 3,636,395 | A | 1/1972 | Banes, Jr. |
| 3,641,389 | A | 2/1972 | Leidigh |
| 3,657,588 | A | 4/1972 | McRae |
| 3,731,133 | A | 5/1973 | McRae |
| 3,764,466 | A | 10/1973 | Dawson |
| 3,806,496 | A | 4/1974 | Shorr et al. |
| 3,808,496 | A | 4/1974 | McRae |
| 3,826,996 | A | 7/1974 | Jaegle et al. |
| 3,900,803 | A | 8/1975 | Silfvast et al. |
| 3,911,318 | A | 10/1975 | Spero |
| 3,949,258 | A | 4/1976 | Soodak |
| 3,982,201 | A | 9/1976 | Rosenkrantz et al. |
| 4,054,812 | A | 10/1977 | Lessner |
| 4,063,803 | A | 12/1977 | Wright |
| 4,088,966 | A | 5/1978 | Samis |
| 4,152,625 | A | 5/1979 | Conrad |
| 4,177,435 | A | 12/1979 | Brown |
| 4,179,037 | A | 12/1979 | Chan |
| 4,179,566 | A | 12/1979 | Nadelson |
| 4,263,095 | A | 4/1981 | Thode |
| 4,272,681 | A | 6/1981 | Fill |
| 4,485,333 | A | 11/1984 | Goldbert |
| 4,498,029 | A | 2/1985 | Yoshizawa et al. |
| 4,536,640 | A | 8/1985 | Vukanovic |
| 4,599,540 | A | 7/1986 | Roberts |
| 4,633,128 | A | 12/1986 | Roberts |
| 4,646,215 | A | 2/1987 | Levin et al. |
| 4,702,716 | A | 10/1987 | Roberts |
| 4,724,352 | A | 2/1988 | Schuda |
| RE32,626 | E | 3/1988 | Yoshizawa et al. |
| 4,730,895 | A | 3/1988 | Siedband et al. |
| 4,780,608 | A | 10/1988 | Cross et al. |
| 4,785,216 | A | 11/1988 | Roberts |
| 4,789,788 | A | 12/1988 | Cox |
| 4,866,517 | A | 9/1989 | Mohizuki |
| 4,868,458 | A | 9/1989 | Davenport et al. |
| 4,872,189 | A | 10/1989 | Frankel |
| 4,889,605 | A | 12/1989 | Asmus |
| 4,901,330 | A | 2/1990 | Wolfram et al. |
| 4,978,893 | A | 12/1990 | Brannon |
| 4,979,893 | A | 12/1990 | Pappalardo et al. |
| 5,052,780 | A | 10/1991 | Klein |
| 5,153,673 | A | 10/1992 | Amirav |
| 5,299,279 | A | 3/1994 | Roberts |
| 5,317,618 | A | 5/1994 | Nakahara |
| 5,334,913 | A | 8/1994 | Ury et al. |
| 5,359,621 | A | 10/1994 | Tsunoda |
| 5,394,413 | A | 2/1995 | Zayhowski |
| 5,418,420 | A | 5/1995 | Roberts |
| 5,442,184 | A | 8/1995 | Palmer et al. |
| 5,506,857 | A | 4/1996 | Meinzer |
| 5,508,034 | A | 4/1996 | Bernstein |
| 5,508,934 | A | 4/1996 | Moslehi |
| 5,516,857 | A | 5/1996 | Mann |
| 5,561,338 | A | 10/1996 | Roberts |
| 5,672,931 | A | 9/1997 | Kiss |
| 5,686,996 | A | 11/1997 | Fidler et al. |
| 5,789,863 | A | 8/1998 | Takahashi |
| 5,790,575 | A | 8/1998 | Zamel et al. |
| 5,801,495 | A | 9/1998 | Smolka et al. |
| 5,903,088 | A | 5/1999 | Sugitani |
| 5,905,268 | A | 5/1999 | Garcia |
| 5,905,572 | A | 5/1999 | Li |
| 5,921,311 | A | 7/1999 | Menendez et al. |
| 5,923,116 | A | 7/1999 | Mercer |
| 5,940,182 | A | 8/1999 | Lepper |
| 6,005,332 | A | 12/1999 | Mercer |
| 6,025,916 | A | 2/2000 | Quick |
| 6,061,379 | A | 5/2000 | Schoen |
| 6,074,516 | A | 6/2000 | Howald |
| 6,106,091 | A | 8/2000 | Osawa et al. |
| 6,108,091 | A | 8/2000 | Pecen |
| 6,129,807 | A | 10/2000 | Grimbergen |
| 6,181,053 | B1 | 1/2001 | Roberts |
| 6,184,517 | B1 | 2/2001 | Sawada et al. |
| 6,200,005 | B1 | 3/2001 | Roberts |
| 6,212,989 | B1 | 4/2001 | Beyer |
| 6,235,147 | B1 | 5/2001 | Lee et al. |
| 6,236,147 | B1 | 5/2001 | Manning |
| 6,265,813 | B1 | 7/2001 | Knox |
| 6,274,970 | B1 | 8/2001 | Capobianco |
| 6,275,565 | B1 | 8/2001 | Tomie |
| 6,281,629 | B1 | 8/2001 | Tanaka |
| 6,285,131 | B1 | 9/2001 | Kiss |
| 6,288,780 | B1 | 9/2001 | Fairley et al. |
| 6,316,867 | B1 | 11/2001 | Roberts |
| 6,331,993 | B1 | 12/2001 | Brown |
| 6,339,279 | B1 | 1/2002 | Miyamoto |
| 6,339,280 | B1 | 1/2002 | Miyamoto |
| 6,351,058 | B1 | 2/2002 | Roberts |
| 6,374,012 | B1 | 4/2002 | Bergmann et al. |
| 6,400,067 | B1 | 6/2002 | Manning |
| 6,400,089 | B1 | 6/2002 | Salvermoser |
| 6,414,436 | B1 | 7/2002 | Eastlund |
| 6,417,625 | B1 | 7/2002 | Brooks et al. |
| 6,445,134 | B1 | 9/2002 | Asmus |
| 6,493,364 | B1 | 12/2002 | Baumler et al. |
| 6,504,319 | B2 | 1/2003 | Herter |
| 6,504,903 | B1 | 1/2003 | Kondo |
| 6,532,100 | B1 | 3/2003 | Partanen |
| 6,541,924 | B1 | 4/2003 | Kane et al. |
| 6,597,087 | B2 | 7/2003 | Roberts |
| 6,602,104 | B1 | 8/2003 | Roberts |
| 6,670,758 | B2 | 12/2003 | Beech |
| 6,737,809 | B2 | 5/2004 | Espiau |
| 6,762,849 | B1 | 7/2004 | Rulkens |
| 6,768,264 | B2 | 7/2004 | Beech |
| 6,788,404 | B2 | 9/2004 | Lange |
| 6,795,182 | B2 | 9/2004 | Rakuljic et al. |
| 6,816,323 | B2 | 11/2004 | Colin et al. |
| 6,821,377 | B2 | 11/2004 | Saito |
| 6,834,984 | B2 | 12/2004 | Tausch |
| 6,865,255 | B2 | 3/2005 | Richardson |
| 6,867,419 | B2 | 3/2005 | Tajima |
| 6,914,919 | B2 | 7/2005 | Watson |
| 6,956,329 | B2 | 10/2005 | Brooks et al. |
| 6,956,885 | B2 | 10/2005 | Taylor |
| 6,970,492 | B2 | 11/2005 | Govorkov |
| 6,972,421 | B2 * | 12/2005 | Melnychuk ......... G03F 7/70033 250/493.1 |
| 7,050,149 | B2 | 5/2006 | Owa et al. |
| 7,072,367 | B2 | 7/2006 | Arisawa |
| 7,087,914 | B2 | 8/2006 | Akins et al. |
| 7,158,221 | B2 | 1/2007 | Davis |
| 7,164,144 | B2 | 1/2007 | Partlo et al. |
| 7,176,633 | B1 | 2/2007 | Roberts |
| 7,274,435 | B2 | 9/2007 | Hiura |
| 7,307,375 | B2 | 12/2007 | Smith et al. |
| 7,368,741 | B2 | 5/2008 | Melnychuk |
| 7,399,961 | B2 | 7/2008 | Chen et al. |
| 7,399,981 | B2 | 7/2008 | Cheymol et al. |
| 7,427,167 | B2 | 9/2008 | Holder et al. |
| 7,429,818 | B2 | 9/2008 | Chang et al. |
| 7,435,982 | B2 | 10/2008 | Smith |
| 7,439,497 | B2 | 10/2008 | Dantus |
| 7,439,530 | B2 | 10/2008 | Ershov |
| 7,456,417 | B2 | 11/2008 | Murakami et al. |
| 7,567,607 | B2 | 7/2009 | Knowles et al. |
| 7,571,349 | B2 | 8/2009 | Levidow et al. |
| 7,598,509 | B2 | 10/2009 | Ershov |
| 7,632,419 | B1 | 12/2009 | Grimgergen |
| 7,652,430 | B1 | 1/2010 | Delgado |
| 7,671,349 | B2 | 3/2010 | Bykanov |
| 7,679,027 | B2 | 3/2010 | Bogatu |
| 7,679,276 | B2 | 3/2010 | Blondia |
| 7,680,158 | B2 | 3/2010 | Endo |
| 7,705,331 | B1 | 4/2010 | Kirk et al. |

(56) References Cited

U.S. PATENT DOCUMENTS

| | | | |
|---|---|---|---|
| 7,773,656 | B1 | 8/2010 | Mills |
| 7,786,455 | B2 | 8/2010 | Smith |
| 7,795,816 | B2 | 9/2010 | Jennings |
| 8,003,963 | B2 | 8/2011 | Nagai et al. |
| 8,143,790 | B2 | 3/2012 | Smith et al. |
| 8,148,900 | B1 | 4/2012 | Kirk et al. |
| 8,242,671 | B2 | 8/2012 | Blondia |
| 8,242,695 | B2 | 8/2012 | Sumitomo |
| 8,253,926 | B2 | 8/2012 | Sumitomo |
| 8,309,943 | B2 | 11/2012 | Smith |
| 8,320,424 | B2 | 11/2012 | Bolt |
| 8,427,067 | B2 | 4/2013 | Espiau |
| 8,525,138 | B2 | 9/2013 | Smith et al. |
| 8,610,095 | B2 | 12/2013 | Yabu et al. |
| 8,710,475 | B2 | 4/2014 | Komori et al. |
| 8,969,841 | B2 | 3/2015 | Smith |
| 9,048,000 | B2 | 6/2015 | Smith |
| 9,065,572 | B1 | 6/2015 | Wach |
| 9,185,786 | B2 | 11/2015 | Smith |
| 9,506,871 | B1 | 11/2016 | Flock |
| 9,576,785 | B2 | 2/2017 | Blondia |
| 9,609,732 | B2 | 3/2017 | Smith |
| 9,678,262 | B2 | 6/2017 | Görtz et al. |
| 9,741,553 | B2 | 8/2017 | Blondia |
| 9,748,086 | B2 | 8/2017 | Blondia |
| 9,922,814 | B2 | 3/2018 | Blondia |
| 10,006,865 | B1 | 6/2018 | Shaughnessy et al. |
| 10,008,378 | B2 | 6/2018 | Blondia |
| 10,057,973 | B2 | 8/2018 | Blondia |
| 10,078,167 | B2 | 9/2018 | Brune et al. |
| 10,109,473 | B1 | 10/2018 | Blondia et al. |
| 10,186,414 | B2 | 1/2019 | Blondia |
| 10,186,416 | B2 | 1/2019 | Blondia |
| 10,203,247 | B2 | 2/2019 | Brady et al. |
| 10,217,625 | B2 | 2/2019 | Bezel et al. |
| 10,222,701 | B2 | 3/2019 | Zhao et al. |
| 10,770,282 | B1 | 9/2020 | Abramenko et al. |
| 10,964,523 | B1 | 3/2021 | Gayasov et al. |
| 11,587,781 | B2 | 2/2023 | Partlow et al. |
| 11,784,037 | B2 | 10/2023 | Partlow et al. |
| 12,014,918 | B2 | 6/2024 | Partlow et al. |
| 12,085,387 | B1 | 9/2024 | Wang et al. |
| 12,144,072 | B2 | 11/2024 | Partlow et al. |
| 12,156,322 | B2 | 11/2024 | Niell, III et al. |
| 12,165,856 | B2 | 12/2024 | Home et al. |
| 12,176,200 | B2 | 12/2024 | Partlow et al. |
| 12,578,076 | B2 | 3/2026 | Wang et al. |
| 2001/0035720 | A1 | 11/2001 | Guthrie |
| 2002/0021508 | A1 | 2/2002 | Ishihara |
| 2002/0036820 | A1 | 3/2002 | Merriam |
| 2002/0044624 | A1 | 4/2002 | Davis et al. |
| 2002/0044629 | A1 | 4/2002 | Hertz et al. |
| 2002/0080834 | A1 | 6/2002 | Kusunose |
| 2002/0172235 | A1 | 11/2002 | Chang et al. |
| 2003/0006381 | A1 | 1/2003 | Yoo |
| 2003/0006383 | A1 | 1/2003 | Melnychuk |
| 2003/0034736 | A1 | 2/2003 | Eastlund |
| 2003/0052609 | A1 | 3/2003 | Eastlund et al. |
| 2003/0066139 | A1 | 4/2003 | Go et al. |
| 2003/0068012 | A1 | 4/2003 | Ahmad et al. |
| 2003/0086139 | A1 | 5/2003 | Wing So |
| 2003/0090902 | A1 | 5/2003 | Kavanaugh |
| 2003/0147499 | A1 | 8/2003 | Kondo |
| 2003/0168982 | A1 | 9/2003 | Kim |
| 2003/0193281 | A1 | 10/2003 | Manning |
| 2003/0231496 | A1 | 12/2003 | Sato et al. |
| 2004/0008433 | A1 | 1/2004 | Margeson |
| 2004/0016894 | A1 | 1/2004 | Wester |
| 2004/0018647 | A1 | 1/2004 | Jones |
| 2004/0026512 | A1 | 2/2004 | Otsubo |
| 2004/0071267 | A1 | 4/2004 | Jacob et al. |
| 2004/0084406 | A1 | 5/2004 | Kamp |
| 2004/0108473 | A1 | 6/2004 | Melnychuk |
| 2004/0129896 | A1 | 7/2004 | Schmidt et al. |
| 2004/0134426 | A1 | 7/2004 | Tomoyasu |
| 2004/0183031 | A1 | 9/2004 | Silverman |
| 2004/0183038 | A1 | 9/2004 | Hiramoto et al. |
| 2004/0218172 | A1 | 11/2004 | Deverse et al. |
| 2004/0238762 | A1 | 12/2004 | Mizoguchi et al. |
| 2004/0239894 | A1 | 12/2004 | Shimada |
| 2004/0245350 | A1 | 12/2004 | Zeng |
| 2004/0264512 | A1 | 12/2004 | Hartlove et al. |
| 2005/0057158 | A1 | 3/2005 | Chang et al. |
| 2005/0167618 | A1 | 8/2005 | Hoshino et al. |
| 2005/0168148 | A1 | 8/2005 | Allen |
| 2005/0199829 | A1 | 9/2005 | Partlo et al. |
| 2005/0205803 | A1 | 9/2005 | Mizoguchi |
| 2005/0205811 | A1 | 9/2005 | Partlo et al. |
| 2005/0207454 | A1 | 9/2005 | Starodoumov |
| 2005/0225739 | A1 | 10/2005 | Hiura |
| 2005/0230645 | A1 | 10/2005 | Melnychuk et al. |
| 2005/0243390 | A1 | 11/2005 | Tejnil |
| 2005/0270528 | A1 | 12/2005 | Geshwind et al. |
| 2005/0276285 | A1 | 12/2005 | Huang et al. |
| 2006/0017387 | A1 | 1/2006 | Smith et al. |
| 2006/0039435 | A1 | 2/2006 | Cheymol et al. |
| 2006/0078017 | A1 | 4/2006 | Endo et al. |
| 2006/0103952 | A1 | 5/2006 | Gouch |
| 2006/0131515 | A1 | 6/2006 | Partlo et al. |
| 2006/0152128 | A1 | 7/2006 | Manning |
| 2006/0176925 | A1 | 8/2006 | Nakano |
| 2006/0186356 | A1 | 8/2006 | Imai et al. |
| 2006/0192152 | A1 | 8/2006 | Ershov et al. |
| 2006/0202625 | A1 | 9/2006 | Song |
| 2006/0215712 | A1 | 9/2006 | Ziener |
| 2006/0219957 | A1 | 10/2006 | Ershov et al. |
| 2006/0228072 | A1 | 10/2006 | Davis et al. |
| 2006/0232215 | A1 | 10/2006 | Bogatu |
| 2006/0255298 | A1 | 11/2006 | Bykanov |
| 2007/0001131 | A1 | 1/2007 | Ershov |
| 2007/0210717 | A1 | 9/2007 | Smith et al. |
| 2007/0228288 | A1 | 10/2007 | Smith |
| 2007/0228300 | A1 | 10/2007 | Smith |
| 2007/0285921 | A1 | 12/2007 | Zulim et al. |
| 2008/0048133 | A1 | 2/2008 | Bykanov |
| 2008/0055712 | A1 | 3/2008 | Noelscher |
| 2008/0059096 | A1 | 3/2008 | Stenstrom |
| 2008/0099699 | A1 | 5/2008 | Yabuta et al. |
| 2008/0180029 | A1 | 7/2008 | Hergenhan et al. |
| 2008/0237501 | A1* | 10/2008 | Hosokai ................ H05G 2/007 250/504 R |
| 2008/0260335 | A1 | 10/2008 | Laitala et al. |
| 2008/0272317 | A1 | 11/2008 | Shumlak et al. |
| 2009/0032740 | A1 | 2/2009 | Smith et al. |
| 2009/0091273 | A1 | 4/2009 | Horioka et al. |
| 2009/0196801 | A1 | 8/2009 | Mills |
| 2009/0267003 | A1 | 10/2009 | Moriya |
| 2009/0314967 | A1 | 12/2009 | Moriya |
| 2010/0007894 | A1 | 1/2010 | Suehira |
| 2010/0164380 | A1 | 7/2010 | Sumitomo |
| 2010/0165656 | A1 | 7/2010 | Yasuda et al. |
| 2010/0172014 | A1 | 7/2010 | Kanade et al. |
| 2010/0181503 | A1 | 7/2010 | Yanagida |
| 2010/0253935 | A1 | 10/2010 | Mackinnon et al. |
| 2010/0264820 | A1 | 10/2010 | Sumitomo |
| 2010/0280321 | A1 | 11/2010 | Modell |
| 2011/0026547 | A1 | 2/2011 | Yokota |
| 2011/0084717 | A1 | 4/2011 | Fong et al. |
| 2011/0150590 | A1 | 6/2011 | Buchner |
| 2011/0181191 | A1 | 7/2011 | Smith et al. |
| 2011/0204265 | A1 | 8/2011 | Smith et al. |
| 2011/0285996 | A1 | 11/2011 | Wang |
| 2011/0291566 | A1 | 12/2011 | Bezel |
| 2013/0234597 | A1 | 9/2013 | Kusunose et al. |
| 2013/0342105 | A1 | 12/2013 | Shchemelinin et al. |
| 2014/0071406 | A1 | 3/2014 | Manni et al. |
| 2014/0117258 | A1 | 5/2014 | Smith |
| 2014/0145615 | A1 | 5/2014 | Goscha et al. |
| 2014/0197733 | A1 | 7/2014 | Delgado |
| 2014/0233016 | A1 | 8/2014 | Aiyer |
| 2014/0268127 | A1 | 9/2014 | Day |
| 2015/0021500 | A1 | 1/2015 | Smith |
| 2015/0034838 | A1 | 2/2015 | Bezel et al. |
| 2015/0131137 | A1 | 5/2015 | Burry et al. |

(56) References Cited

U.S. PATENT DOCUMENTS

| | | | |
|---|---|---|---|
| 2015/0206711 | A1 | 7/2015 | Ozimek et al. |
| 2015/0289353 | A1 | 10/2015 | Smith |
| 2016/0057845 | A1 | 2/2016 | Smith |
| 2016/0057854 | A1 | 2/2016 | Schneider et al. |
| 2016/0093463 | A1 | 3/2016 | Bhattacharjee et al. |
| 2017/0052118 | A1 | 2/2017 | Loock et al. |
| 2017/0135192 | A1 | 5/2017 | Blondia |
| 2017/0150590 | A1 | 5/2017 | Chimmalgi et al. |
| 2017/0213704 | A1 | 7/2017 | Chen |
| 2017/0280545 | A1 | 9/2017 | Tomita et al. |
| 2017/0373460 | A1 | 12/2017 | Yokota |
| 2018/0233333 | A1* | 8/2018 | Chen .................... B01D 53/323 |
| 2018/0247794 | A1 | 8/2018 | Sung et al. |
| 2019/0021158 | A1 | 1/2019 | Nozaki |
| 2019/0037676 | A1 | 1/2019 | Khodykin et al. |
| 2019/0045615 | A1 | 2/2019 | Mori et al. |
| 2019/0053364 | A1 | 2/2019 | Mori et al. |
| 2019/0075641 | A1 | 3/2019 | Kuritsyn et al. |
| 2019/0302570 | A1 | 10/2019 | Kumar et al. |
| 2019/0373687 | A1 | 12/2019 | Williams et al. |
| 2020/0012165 | A1 | 1/2020 | Haller |
| 2020/0051785 | A1 | 2/2020 | Miller et al. |
| 2020/0084870 | A1 | 3/2020 | Hudgins et al. |
| 2020/0371344 | A1 | 11/2020 | Eng et al. |
| 2020/0393687 | A1 | 12/2020 | Yabu et al. |
| 2021/0112647 | A1 | 4/2021 | Coleman |
| 2021/0120659 | A1 | 4/2021 | Szilagyi et al. |
| 2021/0282256 | A1 | 9/2021 | Abramenko et al. |
| 2022/0229307 | A1 | 7/2022 | Wang et al. |
| 2022/0375740 | A1 | 11/2022 | Partlow et al. |
| 2023/0178357 | A1 | 6/2023 | Partlow et al. |
| 2023/0268167 | A1 | 8/2023 | Horne et al. |
| 2023/0319959 | A1 | 10/2023 | Partlow et al. |
| 2023/0363639 | A1 | 11/2023 | Preciado |
| 2023/0420242 | A1 | 12/2023 | Partlow et al. |
| 2024/0196506 | A1 | 6/2024 | Niell, III et al. |
| 2024/0297035 | A1 | 9/2024 | Partlow et al. |
| 2024/0401775 | A1 | 12/2024 | Wang et al. |
| 2025/0040004 | A1 | 1/2025 | Partlow et al. |
| 2025/0056705 | A1 | 2/2025 | Niell, III et al. |
| 2025/0069870 | A1 | 2/2025 | Horne et al. |
| 2025/0081319 | A1 | 3/2025 | Niell, III et al. |
| 2025/0102290 | A1 | 3/2025 | Wang et al. |
| 2026/0011981 | A1 | 1/2026 | Buch |

FOREIGN PATENT DOCUMENTS

| | | | |
|---|---|---|---|
| CN | 101989048 | A | 3/2011 |
| CN | 102881546 | A | 1/2013 |
| CN | 103066491 | A | 4/2013 |
| CN | 105283924 | A | 1/2016 |
| CN | 210533985 | U | 5/2020 |
| CN | 211315851 | U | 8/2020 |
| CN | 111653926 | A | 9/2020 |
| CN | 111769434 | A | 10/2020 |
| CN | 112470069 | A | 3/2021 |
| DE | 19910725 | A1 | 10/1999 |
| DE | 102011113681 | A1 | 3/2013 |
| DE | 10-2019-107924 | A1 | 10/2020 |
| EP | 0151188 | B1 | 11/1991 |
| EP | 1083777 | A9 | 3/2001 |
| EP | 1397030 | A1 | 3/2004 |
| EP | 1313128 | B1 | 5/2011 |
| EP | 2469250 | A2 | 6/2012 |
| EP | 2534672 | B1 | 6/2016 |
| FR | 1471215 | A | 3/1967 |
| FR | 2554302 | A1 | 5/1985 |
| GB | 2266406 | A | 10/1993 |
| JP | 53-103395 | A | 9/1978 |
| JP | 61-193358 | A | 8/1986 |
| JP | S62-222559 | A | 9/1987 |
| JP | 1-296560 | A | 11/1989 |
| JP | 4-144053 | A | 5/1992 |
| JP | H05-61397 | A | 3/1993 |
| JP | 5-82087 | A | 4/1993 |
| JP | H05-82087 | B2 | 11/1993 |
| JP | 8-299951 | A | 11/1996 |
| JP | H09-508755 | A | 9/1997 |
| JP | 9-288995 | A | 11/1997 |
| JP | 2003-218025 | A | 7/2003 |
| JP | 2003-317675 | A | 11/2003 |
| JP | 2004-134166 | A | 4/2004 |
| JP | 2004-526188 | A | 8/2004 |
| JP | 2005-522839 | A | 7/2005 |
| JP | 2006-010675 | A | 1/2006 |
| JP | 2006-054270 | A | 2/2006 |
| JP | 2006-080255 | A | 3/2006 |
| JP | 2006-194925 | A | 7/2006 |
| JP | 2007-506947 | A | 3/2007 |
| JP | 2008-506238 | A | 2/2008 |
| JP | 2008-270149 | A | 11/2008 |
| JP | 4255662 | B2 | 4/2009 |
| JP | 2009-140762 | A | 6/2009 |
| JP | 2010-087388 | A | 4/2010 |
| JP | 2010-170994 | A | 8/2010 |
| JP | 2010-171159 | A | 8/2010 |
| JP | 2011-023712 | A | 2/2011 |
| JP | 2011-035039 | A | 2/2011 |
| JP | 2011-048285 | A | 3/2011 |
| JP | 2011-081274 | A | 4/2011 |
| JP | 2011-082473 | A | 4/2011 |
| JP | 2012-018415 | A | 1/2012 |
| JP | 2013-041954 | A | 2/2013 |
| JP | 2013-187098 | A | 9/2013 |
| JP | 2015-506106 | A | 2/2015 |
| JP | 2015-519605 | A | 7/2015 |
| JP | 2015-166757 | A | 9/2015 |
| JP | 2016-138989 | A | 8/2016 |
| JP | 2017-220439 | A | 12/2017 |
| JP | 2017-228671 | A | 12/2017 |
| JP | 6243845 | B2 | 12/2017 |
| JP | 2018-006394 | A | 1/2018 |
| JP | 2018-125227 | A | 8/2018 |
| JP | 2018-531487 | A | 10/2018 |
| JP | 2019-021432 | A | 2/2019 |
| JP | 2019-511819 | A | 4/2019 |
| JP | 2021-141037 | A | 9/2021 |
| JP | 2022-017024 | A | 1/2022 |
| JP | 2022-519547 | A | 3/2022 |
| KR | 10-2001-0062437 | A | 7/2001 |
| KR | 10-2005-0003392 | A | 1/2005 |
| KR | 10-2006-0064319 | A | 6/2006 |
| KR | 10-2006-0087004 | A | 8/2006 |
| KR | 10-2008-0108111 | A | 12/2008 |
| KR | 10-2010-0114455 | A | 10/2010 |
| KR | 10-2011-0013226 | A | 2/2011 |
| KR | 10-1269115 | B1 | 5/2013 |
| KR | 10-2016-0071231 | A | 6/2016 |
| KR | 10-1639963 | B1 | 7/2016 |
| KR | 10-2019-0067631 | A | 6/2019 |
| KR | 10-2020-0017137 | A | 2/2020 |
| KR | 10-2020-0084841 | A | 7/2020 |
| NL | 8403294 | A | 6/1985 |
| RU | 2266628 | C2 | 12/2005 |
| RU | 2278483 | C2 | 6/2006 |
| RU | 2326463 | C2 | 6/2008 |
| RU | 2732999 | C1 | 9/2020 |
| RU | 2780202 | C1 | 9/2022 |
| TW | 200610452 | A | 3/2006 |
| TW | 201713788 | A | 4/2017 |
| TW | 201801132 | A | 1/2018 |
| TW | 201843695 | A | 12/2018 |
| TW | 202226738 | A | 7/2022 |
| WO | 94/10729 | A1 | 5/1994 |
| WO | 98/11388 | A1 | 3/1998 |
| WO | 98/54611 | A2 | 12/1998 |
| WO | 99/18594 | A1 | 4/1999 |
| WO | 02/087291 | A2 | 10/2002 |
| WO | 03/079391 | A2 | 9/2003 |
| WO | 2004/023061 | A2 | 3/2004 |
| WO | 2004/084592 | A2 | 9/2004 |
| WO | 2004/097520 | A2 | 11/2004 |
| WO | 2005/004555 | A2 | 1/2005 |
| WO | 2006/017119 | A2 | 2/2006 |

(56) References Cited

FOREIGN PATENT DOCUMENTS

| | | | |
|---|---|---|---|
| WO | 2007/002170 | A2 | 1/2007 |
| WO | 2010/093903 | A2 | 8/2010 |
| WO | 2017/062274 | A1 | 4/2017 |
| WO | 2018/136683 | A1 | 7/2018 |
| WO | 2019/023150 | A1 | 1/2019 |
| WO | 2019/023303 | A1 | 1/2019 |
| WO | 2019/049694 | A1 | 3/2019 |
| WO | 2022/159352 | A1 | 7/2022 |
| WO | 2022/251000 | A1 | 12/2022 |
| WO | 2023/158909 | A1 | 8/2023 |
| WO | 2023/192696 | A1 | 10/2023 |
| WO | 2024/123564 | A1 | 6/2024 |
| WO | 2024/123565 | A1 | 6/2024 |
| WO | 2024/253718 | A1 | 12/2024 |
| WO | 2025/049100 | A1 | 3/2025 |

OTHER PUBLICATIONS

Mobarhan, "Test and Characterization of Laser Diodes: Determination of Principal Parameters", 1999, pp. 1-7.
Moody, "Maintenance of a Gas Breakdown in Argon Using 10.6-μ cw Radiation", Journal of Applied Physics, vol. 46, No. 6, Jun. 1975, pp. 2475-2482.
Mora, "Theoretical Model of Absorption of Laser Light by a Plasma", Phys. Fluids, vol. 25, No. 6, 1982, pp. 1051-1056.
Mordovanakis et al., "Demonstration of Fiber-laser-produced Plasma Source and Application to Efficient Extreme UV Light Generation", Optics Letter, vol. 31, No. 17, 2006, pp. 2517-2519.
Mosier-Boss et al., "Detection of Lead Derived from Automotive Scrap Residue Using a Direct Push Fiber-Optic Laser-Induced Breakdown Spectroscopy Metal Sensor", Applied Spectroscopy, vol. 59, No. 12, 2005, pp. 1445-1456.
Mosier-Boss et al., "Field Demonstrations of a Direct Push FO-LIBS Metal Sensor", Environ. Sci. Technol., vol. 36, 2002, pp. 3968-3976.
Motomura et al., "Temporal VUV Emission Characteristics Related to Generations and Losses of Metastable Atoms in Xenon Pulsed Barrier Discharge", J. Light & Vis. Env. vol. 30, No. 2, 2006, pp. 81-86.
Moulton, "Tunable Solid-State Lasers", Proceedings of the IEEE, vol. 80, No. 3, 1992, pp. 348-364.
Muller et al., "Theoretical Model for a Continuous Optical Discharge", Physica, 112C, 1982, pp. 259-270.
Nagano et al., "Present Status of Laser-Produced Plasma EUV Light Source", Proc. Of SPIE, vol. 7636, 2010, pp. 76363C-1-76363C-9.
Nakar et al., "Radiometric Characterization of Ultrahigh Radiance Xenon Short-Arc Discharge Lamps, Ben-Gurion University", Applied Optice, vol. 47,No. 2, Jan. 9, 2008.
Neukum, "Vom Halbleiterchip zum Laserwerkzeug", 2007, pp. 18-20.
Nikitin et al., "Guiding of Intense Femtosecond Pulses in Preformed Plasma Channels", Optics Letter, vol. 22, No. 23, 1997, pp. 1787-1789.
Norimatsu et al., "Cryostat to Provide a Solid Deuterium Layer in a Plastic Shell for the Gekko XII Glass Laser System", Review Of Scientific Instruments, vol. 63, No. 6, 1992, pp. 3378-3383.
Zajac et al., "10 W cw Nd-Doped Double-clad Fiber Laser Operating at 1.06 μm", Proceedings of SPIE vol. 5036, 2003, pp. 135-138.
OEM Compact Fiber Laser module 1090nm 10-20W CW/M With GTWave Technology, SPI Lasers LLC.
Oettinger et al., Plasma Ionization Enhancement by Laser Line Radiation, AIAA Journal, vol. 8, No. 5, 1970, pp. 880-885.
Yusim et al., "100 Watt, single-mode, CW, Linearly Polarized All-fiber Format 1.56um Laser with Suppression of Parasitic Lasing Effects", Proceedings of SPIE, vol. 5709, 2005, pp. 69-77.
Yoshizawa et al., "Disk-shaped Vacuum Ultraviolet Light Source Driven by Microwave Discharge for Photoexcited Processes", Appl. Physc. Lett., vol. 559, 1991, pp. 1678-1680.
Yoshino et al., "Absorption Spectrum of Xenon in the Vacuum-Ultraviolet Region",J. Opt. Soc. Am. B/vol. 2, No. 8, 1985, pp. 1268-1274.
Yamanaka, "Inertial Confinement Fusion Research at ILE Osaka", Nuclear Fusion, vol. 25, No. 9, 1985, pp. 1343-1349.
Yamakoshi et al., "Extreme-Ultraviolet Laser Photo-Pumped by a Self-Healing Hg Target",SPIE, Vo.. 2015, 1994, pp. 227-231.
Orth et al., "High-Resolution Spectra of Laser Plasma Light Sources in the Normal Incidence XUV Region", Applied Optics, vol. 25, No. 13, 1986, pp. 2215-2217.
OSRAM Opto Semiconductors Announces New Solutions for Laser Applications; New Offerings Provide High Output and Enhanced Reliability, Business Wire, Jun. 28, 2005, pp. 1-3.
Oxford Dictionary of Astronomy, definition of bound-bound transition, 2003, p. 59.
Pankert et al., "EUV Sources for the Alpha-Tools", Proc. Of SPIE, vol. 6151, 2006, pp. 1-9.
Pappas et al., "Formation of a Cesium Plasma by Continuous-Wave Resonance Excitation", Applied Spectroscopy, vol. 54, No. 8, 2000, pp. 1245-1249.
Parker, "McGraw-Hill Dictionary of Scientific and Technical Terms",5th Edition, 1994, p. 561.
Patel et al., "The Suitability of Sapphire for Laser Windows",Meas. Sci. Technol., vol. 10, 1999, pp. 146-151.
Pebler et al., "Stabilizing the Radiant Flux of a Xenon Arc Lamp", Applied Optice, vol. 20, No. 23, 1981, pp. 4059-4061.
Perry, "Solar Thermal Propulsion: An Investigation Of Solar Radiation Absorption In A Working Fluid", 1984 pp. 1-70.
Petring et al., "High Power Diode Lasers", Technology and Applications, 2007, pp. 285-533.
Phillip, "Optical Properties of Non-Crystalline Si, SiO, SiOx and SiO2", J. Phys. Chem. Solids, vol. 32, 1971, pp. 1935-1945.
Phillip, "Optical Transitions in Crystalline and Fused Quartz", Solid State Communications vol. 4, 1966, pp. 73-75.
Phillips et al., "Characterization and Stabilization of Fiber-Coupled Laser Diode Arrays", Review Of Scientific Instruments, vol. 70, No. 7, 1999, pp. 2905-2909.
Plyler et al., "Precise Measurement of Wavelengths in Infrared Spectra", Journal of Research of the National Bureau of Standards, vol. 55, No. 5, 1955, pp. 279-284.
Polijanczuk et al., "Semiconductor Lasers for Microsoldering", 1991, pp. 6/1-6/4.
Prabhu et al., "High-Power CW Raman Fiber Laser Using Phosphosilicate Fiber Pumped by Yb-doped Double-clad Fiber Laser", IEE Colloquium on Advances in Interconnection Technology, 2001, pp. 482-485.
Raizer, "Continuous Optical Discharge: Generation and Support of Dense Low-Temperature Plasma by Laser Irradiation", 1996, pp. 87-94.
Raizer, "Gas Discharge Physics",1991, pp. 1-449.
Raizer, "Optical Discharges," Sov. Phys. Usp., vol. 23, No. 11, 1980, pp. 789-806.
Rhemet, "Xenon Lamps", IEE Proc.,vol. 127, Pt. A, No. 3, 1980, pp. 190-195.
Richardson et al., "High Conversion Efficiency Mass-Limited Sn-Based Laser Plasma Source for Extreme Ultraviolet Lithography", J. Vac. Sci. Technol. B., vol. 22, No. 2, 2004, pp. 785-790.
Rietdorf et al., "Special Optical Elements", J. (eds) Handbook Of Biological Confocal Microscopy, 2006, pp. 43-58.
Rockstroh et al., "Spectroscopic Studies of Plasma During CW Laser Materials Interaction", J. Appl. Phys., vol. 61, No. 3, 1987, pp. 917-922.
Roth et al., "Directly Diode-laser-pumped Ti:sapphire laser", Optics Letters, vol. 34, No. 21, 2009, pp. 3334-3336.
Sacchi, "Laser-Induced Electric Breakdown in Water", J. Opt. Soc. Am. B, vol. 28, No. 2, 1991, pp. 337-345.
Sakamoto et al., "120W CW Output Power from Monolithic AlGaAs (800nm) Laser Diode Array Mounted on Diamond Fleatsink", Electronic Letter, vol. 28, No. 2, 1992, pp. 197-199.
Saloman, "Energy Levels and Observed Spectral Lines of Xenon, Xe(I) through Xe(LIV)", J. Phys. Chem. Ref. Data, vol. 33, No. 3, 2004, pp. 765-921.

(56) References Cited

OTHER PUBLICATIONS

Saraswat et al., "Single Wafer Rapid Thermal Multiprocessing", Mat. Res. Soc. Symp. Proc. vol. 146, 1989, pp. 3-13.
Anonymous: "Toroidal Mirrors TRseries:Shimadzu Corporation",Oct. 27, 2020, XP093222739, 7 pages. Retrieved from the Internet:URL:https://web.archive.org/web/20201027085809/https://www.shimadzu.com/opt/products/aspherical/o-k25cur0000007p3b.html.
International Preliminary Report on Patentibility received for PCT Application No. PCT/US2023/08138, mailed on Jun. 19, 2025, 6 pages.
Reisman et al., "Inductively coupled plasma light source driven by an all solid-state pulsed power system". Applied Physics Letters, vol. 123, Issue 18, Nov. 2, 2023, 6 pages. [retrieved on Oct. 17, 2024], Retrieved from <https://doi.org/10.1063/5.0174510>.
Sereda et al., "High-power IR Lasers Operating on Xe I Transitions", Quantum Electron, vol. 23, No. 6, 1993, pp. 459-480,.
Swiderski et al., Q-switched Nd-doped double-clad fiber laser, Opto Electronics Review, vol. 13, No. 3, 2005, pp. 187-191.
Hanselman, "Laser-Light Thomson and Rayleigh Scattering in Atmospheric-Pressure Laboratory Plasmas", 1993, Department of Chemistry, pp. ii-385.
Hansson et al., "Liquid-Xenon-Jet Laser-Plasma Source for EUV Lithography", SPIE, vol. 4506, 2001, pp. 1-8.
Hansson, "Laser-Plasma Sources For Extreme-Ultraviolet Chaps. 5 & 6", 2003, pp. 1-58.
Harris, "A Century of Sapphire Crystal Growth Proceedings", Proceedings of the 10th DoD Electromagnetic Windows Symposium Norfolk, 2004, pp. 1-56.
Harris, "Review Of Navy Program To Develop Optical Quality Diamond Windows And Domes", Naval Air Systems Command, 2002, pp. 1-16.
Harrison et al., "Low-threshold, cw, All-solid-state Ti:Al203 Laser", Optics Letter, vol. 16, No. 8, 1991, pp. 581-583.
Hawke et al., "An Apparatus for High Pressure Raman Spectroscopy", Rev. Sci. Instrum., vol. 45, No. 12, 1974, pp. 1598-1601.
Haysom, "Quantum Well Intermixing of InGaAs(P)/InP Heterostructures", Department of Physics, 2001, pp. ii-224.
Hebner et al., "Measured Pressure Broadening and Shift Rates of the 1.73 μm (5d[3/21]1-6p[5/2]2) Transition of Xenon", Applied Physics Letters, vol. 59, No. 9, 1991, pp. 537-539.
Hecht, "Fiber Lasers: Fiber Lasers: The state of the art", Laser Focus World, 2012, pp. 1-11.
Hecht, "Refraction", Optics (Third Edition), Chapter 4, 1998, pp. 100-101.
High Power Diode Laser, Rofin-Sinar Technologies, Inc., 2000, pp. 1-26.
Horn et al., "Evaluation and Design of a Solid-State 193 nm OPO-Nd:YAG Laser Ablation System", Spectroch mica Acta Part B, vol. 58, 2003, pp. 1837-1846.
Hou et al., "Fiber Laser For EUV Generation", EUV Source Workshop, 2006.
Hou et al., "High Intensity Fiber Lasers: Emerging New Applications and New Fiber Technologies", IEEE LEOS Newsletter, 2007, pp. 22-25.
Hou et al., "High Power Fiber Laser Driver for Efficient EUV Lithography Source with Tin-Doped Water Droplet Targets", Optics Expres,, vol. 16, No. 2, 2008, pp. 965-974.
Hu et al., "Laser Induced Stabilisation of the Welding Arc", 2005, Science and Technology of Welding and Joining, vol. 10, No. 1, pp. 76-81.
Huffman et al., "Absorption Coefficients of Xenon and Argon in the 600-1025 Angstrom Wavelength Regions", The Journal of Chemical Physocs, vol. 39, 1963, pp. 902-909.
Hughes, "Plasmas And Laser Light", University of Essex, 1975, pp. 200-272.
I.M. Beterov et al. "Resonance radiation plasma (photoresonance plasma)", Soy. Phys. Usp. vol. 31, No. 66, 1988, pp. 535-554.
Instruction Manual: LDC-3722 Laser Diode Controller, ILX Lightwave Corporation, 1990, pp. 1-Jan. 4, 33.
Zimakov, "Continuous Optical Discharges Sustained by Near-IR Laser Radiation", 42th international conference on plasma physics and CF, 2015, p. 1.
Zhang et al., "Designing a High Performance TEC Controller", Proceedings of SPIE vol. 4913, 2002, pp. 177-183.
Jahier et al.,"Implementation of a Sapphire Cell with External Electrodes for Laser Excitation of a Forbidden Atomic Transition in a Pulsed E-Field", Eur. Phys. J.D., vol. 13, 2001, pp. 221-229.
Jansson et al., "Liquid-Tin-Jet Laser-Plasma Extreme Ultraviolet Generation", Applied Physics Letters, vol. 84, No. 13, 2004, pp. 2256-2258.
Jaroszynski et al., "Radiation Sources Based on Laser-Plasma Interactions", Phil. Trans. R. Soc. vol. 364,2006, pp. 689-710.
Jauregui et al., "High-power Fibre Lasers", Nature Photonics, vol. 7, 2013, pp. 861-867.
Jeng et al., "Theoretical Investigation of Laser-Sustained Argon Plasmas," J. Appl. Phys., vol. 60, No. 7, Oct. 1, 1986, pp. 2272-2279.
Jinno et al., "Luminance and efficacy improvement of low-pressure xenon pulsed fluorescent lamps by using an auxiliary external electrode", J. Phys. D: Appl. Phys., vol. 40, 2007, pp. 3889-3895.
Jinno et al., "The Afterglow Characteristics of Xenon Pulsed Plasma for Mercury-Free Fluorescent Lamps", Czech. J. Phys., vol. 50, 2000, pp. 433-436.
Johnson, "Ultraviolet Emission Spectra of High-Pressure Rare Gases", 1970, Journal Of The Optical Society Of America,, vol. 60, No. 12, pp. 1669-1674.
Joshi et al., "Laser-Induced Breakdown Spectroscopy for In-Cylinder Equivalence Ratio Measurements in Laser-Ignited Natural Gas Engines", Applied Spectroscopy, vol. 63, No. 5, 2009, pp. 549-554.
Kaku et al., "Vacuum Ultraviolet Spectroscopic System Using a Laser-Produced Plasma", Journal of Applied Physics, vol. 42, 2003, pp. 3458-3462.
Kaku et al., "Vacuum Ultraviolet Transmission Spectroscopic System using a Laser-Produced Plasma", The Japan Society of Applied Physics, vol. 42, No. 6R, pp. 149-152.
Keefer et al., "Experimental Study of a Stationary Laser-Sustained Air Plasma," Journal of Applied Physics, vol. 46, No. 3, Mar. 1975, pp. 1080-1083.
Keefer et al., "Power Absorption Laser Sustained Argon Plasmas", AIAA Journal, vol. 24, No. 10, 1986, pp. 1663-1669.
Keefer, "Laser-Sustained Plasmas", 1989, pp. 169-206.
Kennedy et al., "A Review of the Use of High Power Diode Lasers in Surface Hardening, Journal of Materials Processing Technology", vol. 155-156, 2004, pp. 1855-1860.
Keyser et al. "Studies of High-Repetition-Rate Laser Plasma EUV Sources from Droplet Targets", Applied Physics A, vol. 77, 2003, pp. 217-221.
Kim et al., "Development of an In Situ Raman Spectroscopic System for Surface Oxide Films on Metals and Alloys in High Temperature Water, Nuclear Engineering and Design", vol. 235, 2005, pp. 1029-1040.
Kindel et al., Measurement of Excited States Density and the VUV-Radiation in the Pulsed Xenon Medium Pressure Discharge, Contrib. Plasma Phys., vol. 36, 1996, pp. 711-721.
Kirk et al., "Methods and Systems for Providing Illumination of a Specimen for Inspection" U.S. Appl. No. 60/806,204, filed Jun. 29, 2006, 48 pages.
Kirk et al., "Methods and Systems for Providing Illumination of a Specimen for Inspection", U.S. Appl. No. 60/759,846, filed Jan. 17, 2006, 18 pages.
Kirk et al., "Methods and Systems for Providing Illumination of a Specimen for Inspection", U.S. Appl. No. 60/772,425, filed Feb. 9, 2006, 20 pages.
Klein, "Measurements of Spectral Emission and Absorption of a High Pressure Xenon Arc in the Stationary and the Flashed Modes", 1968, pp. 677-685.
Klocke et al., "Investigation into the Use of High Power Diode Lasers for Hardening and Thermal Conduction Welding of Metals", SPIE, vol. 3097, 1997, pp. 592-598.

(56) References Cited

OTHER PUBLICATIONS

Knyazev, "Photoresonance Plasma Production by Excimer Lasers as a Technique for Anode-plasma Formation", Nucl. Instr. and Meth. in Phys. Res. A, vol. 415, 1998, pp. 525-532.
Kolb et al., "Low Optical Loss Synthetic Quartz", Mat. Res. Bull. vol. 7, 1972, pp. 397-406.
Kondow et al., "Temperature Dependence of Lasing Wavelength in a GaInNAs Laser Diode", IEEE Photonics Technology Letters, vol. 12, No. 7, 2000, pp. 777-779.
Kopecek et al., "Laser Ignition of Methane-Air Mixtures at High Pressures and Diagnostics", Journal of Engineering for Gas Turbines and Power, vol. 127, 2005, pp. 213-219.
Benk et al., "Brilliance Scaling Of Discharge Sources For Extreme-ultraviolet And Soft X-ray Radiation For Metrology Applications", J. Micro/Nanolith. MEMS MOEMS, vol. 11, No. 2, Apr.-Jun. 2012, pp. 021106-1-21106-1-7.
International Search Report and Written Opinion received for corresponding PCT Patent Application No. PCT/US2023/081385, mailed on Mar. 29, 2024, 11 pages.
User Manual: Cyberlight, Cyberlight Cx, Cyberlight Sv (Version 2.0), High End Systems, Inc., (1996).
Ushio Super-High Pressure Mercury Lamps, including USH-102D, USH-102DH, USH-205DP, USH-2055, USH-206D/M4, USH-250D, USH-250BY, USH-350DS, USH-351DS, USH-350DP, USH-450G5, USH-450GL, USH-500BY, USH-500MB, USH-502MB, USH-500T, Ush -505MC,USH-5085, USH-508SA, USH-5095, USH-1000DW, USH-1000MC, USH-1000KS, USH-1002DW, Ushio.
Vadla et al., "Resonantly Laser Induced Plasmas in Gases: The Role of Energy Pooling and Exothermic Collisions in Plasma Breakdown and Heating", Spectrochimica Acta Part B, vol. 65, 2010, pp. 33-45.
Vampola, "P78-2 Engineering Overview", Defence Technical Information Centre, 1981, pp. 1-36.
Vukanovic et al., "A New Type of D.C. Arc as Spectrochemical Light Source", Spectrochimica Acta, vol. 29B, 1974, pp. 33-36.
Wang, "Self-Assembled Indium Arsenide Quantum-Dash Lasers of Indium Phosphide Substrates", Electrical and Computer Engineering, 2002, pp. vi-150.
Waynant et al., "Electro-Optics Handbook", Eds., 20002, pp. 1-1000.
Webb et al., Handbook Of Laser Technology And Applications, Applications, vol. III, 2004, pp. 1587-1611.
Wei, "Transparent Ceramic Lamp Envelope Materials", J. Phys. D: Appl. Phys., vol. 38, 2005, pp. 3057-3065.
Weinrotter et al., "Application of Laser Ignition to Hydrogen-Air Mixtures at High Pressures", International Journal of Hydrogen Energy, vol. 30, 2005, pp. 319-326.
Weinrotter et al., "Laser Ignition of Engines", Laser Physics, vol. 15, No. 7,2005, pp. 947-953.
Wiehle et al., "Dynamics of Strong-Field Above-Threshold Ionization of Argon: Comparison Between Experiment and Theory", Physical Review A, vol. 67, 2003, pp. 063405-1-063405-7.
Wieman et al., "Using Diode Lasers for Atomic Physics", Rev. Sci. Instrum., vol. 62, No. 1, 1991, pp. 1-20.
Wilbers et al., "The Continuum Emission of an Arc Plasma," J. Quant. Spectrosc. Radiat. Transfer, vol. 45, No. 1, 1991, pp. 1-10.
Wilbers et al., "The VUV Emissivity of a High-Pressure Cascade Argon Arc from 125 to 200 nm," J. Quant. Spectrosc. Radiat. Transfer, vol. 46, 1991, pp. 299-308.
Winter et al., "Experimental and Theoretical Investigations of a Helium-Xenon Discharge in Spot Mode", 28th ICGQP, 2007 pp. 1979-1982.
Wood, "Atomic Processes: Bound-bound transitions (Einstein coefficients)", available at http://www-star.st-and.ac.uk-kw25/teaching/nebulae/lecture06_einstein.pdf, 2014, pp. 1-10.
World Record Powers Achieved in Single-Mode Fiber Lasers—Powers Scalable to IkW and Beyond, Southampton Photonics, Inc., 2003, pp. 1-2.
Wroblewski et al., "An Experimental Investigation of the Continuous Optical Discharge", Journal of Physique, 1979, pp. 733-734.
Wu et al., "Extreme Ultraviolet Lithography: Towards the Next Generation of Integrated Circuits", vol. 7, 2009, pp. 1-4 (2009).
Xenakis et al., "Laser-plasma X-ray Generation Using an Injection-mode-locked XeCl Excimer Laser", J. Appl. Phys., vol. 71, No. 1, 1992, pp. 85-93.
Xu et al., "Wavelength- and Time-Resolved Investigation of Laser-Induced Plasmas as a Continuum Source", Applied Spectroscopy, vol. 47, No. 8, 1993, pp. 1134-1139.
Yamada et al., "Ionization Mechanism of Cesium Plasma Produced by Irradiation of Dye Laser", 1992,Jpn. J. Appl. Phys. vol. 31, pp. 377-380.
Ballard et al., "High-Power, Laser-Produced-Plasma EUV Source", Proc. SPIE, vol. 4688, 2002, pp. 302-309.
Chen et al., "High-temperature Operation of Periodic Index Separate Confinement Heterostructure Quantum Well Laser", Apll. Phys. Lett., vol. 59, No. 22, 1991, pp. 2784-2786.
Coffey, "Fiber Lasers Achieve World-Record Powers", 2003, pp. 13-14.
Coherent, "Conduction-Cooled Bar Packages (CCPs), 965-985 nm", 2015, pp. 1-4.
Cohn et al., "Magnetic-Field-Dependent Breakdown of CO2-Laser-Produced Plasma", Appl. Phys. Lett., vol. 20, No. 6, 1972, pp. 225-227.
Cooley et al., "Fundamentals of Discharge Initiation in Gas-Fed Pulsed Plasma Thrusters", The 29th International Electric Propulsion Conference, Princeton University, 2005, pp. 1-11.
Cooper, "Spectroscopic Identification of Water-Oxygen and Water-Hydroxyl Complexes and their Importance to Icy Duter Solar System Bodies", Chemistry School of Biomedical and Chemical Sciences, 2004, pp. 1-116.
Cremers et al., "Evaluation of the Continuous Optical No. 4, 1985, pp. 665-679. Discharge for Spectrochemical Analysis," Spectrochimica Acta, vol. 40B, No. 4, 1985, pp. 665-679.
Cross et al., "High Kinetic Energy (1-10eV) Laser Sustained Neutral Atom Beam Source", Nuclear Instruments and Methods in Physics Research B13, 198, pp. 658-662.
Cu-Nguyen et al., "Tunable Confocal Hyperspectral Imaging System", Optical MEMS and Nanophotonics, 2013, pp. 9-10.
Cu-Nguyen et al., "Tunable Hyperchromatic Lens System for Confocal Hyperspectral Sensing", Optics Express, vol. 21, No. 13, 2013, pp. 27611-27621.
Daily et al., "Two-Photon Photoionization of the Ca 4s3d(1)D(2) Level in an Optical Dipole Trap", Physical Review A, vol. 71, 2005, pp. 043406-1-343406-5.
Davis, "Lasers And Electra-Optics: Fundamentals And Engineering", 1996, pp. 1-35.
De Jong et al., "A Pulsed Arc-Glow Hollow Cathode Lamp", Spectroehimlea Acta, vol. 29B, 1974, pp. 179-190.
Demtroder, "Laser Spectroscopy: Basic Concepts And Instrumentation", Second Enlarged Edition, 1982, pp. 395-398.
Derra et al., "UHP Lamp Systems for Projection Applications", J. Phys. D: Appl. Phys. vol. 38, 2005, pp. 2995-3010.
DET25K—GaP Detector, 150-550 nm, 1 ns Rise Time, 4.8 mm2, 8-32 Taps, Thorlabs, 2005, p. 1.
Digonnet, "Rare-Earth-Doped Fiber Lasers And Amplifiers", Optical Engineering, 2001, pp. 144-170.
Diwakar et al., "Role of Laser Pre-Pulse Wavelength and Inter-Pulse Delay on Signal Enhancement in Collinear Double-Pulse Laserlinduced Breakdown Spectroscopy", Spectrochimia Acta, Part B, 2013, pp. 65-73.
Dorsch et al., "Performance and Lifetime of High-Power Diode Lasers and Diode Laser Systems", Proc. SPIE, vol. 3628, 1999, pp. 56-63.
Dorsch et al., 2 kW cw Fiber-coupled Diode Laser System, Proceedings of SPIE vol. 3889, 2000, pp. 45-53.
Durfee III et al., "Development of a Plasma Waveguide for High-Intensity Laser Pulses", Physical Review E, vol. 51, No. 3, 1995, pp. 2368-2389.
Dusterer et al., "Optimization of EUVRradiation Yield from Laser-Produced Plasma", Appl. Phys., B-73, 2001, pp. 693-698.
Eckstrom et al., "Microwave Interactions With Plasmas", IEEE Trans. Plasma Sci. vol. 18, 1992, pp. 1-9 with appendixes.
Edmund Optics, Lens UV-SCX 25mm DIA x 25mm FL Uncoated (Drawing), p. 1.

(56) References Cited

OTHER PUBLICATIONS

Eletskii et al., "Formation kinetics and parameters of a photoresonant plasma", Soy. Phys. JETP, vol. 67, No. 5, 1988, pp. 920-924.
Emmett et al., "Direct Measurement of Xenon Flashtube Opacity", Journal of Applied Physics,vol. 35, No. 9, 1964, pp. 2601-2604.
Endo et al., "Laser Produced EUV Light Source Development for HVM", Spie Advanced Lithography, 2007, pp. 1-25.
Erskine et al., "Measuring Opacity of Shock Generated Argon Plasmas" ,J. Quart Spectro. Radial Transfer, vol. 51, No. 12, 1994, pp. 97-100.
F10T/F10T2 and F6 Lightshield Systems Parts Listing, Heraeus Noblelight America LLC, 2015, pp. 1-12.
F300S/F300SQ UV Lamp System Parts Listing, Heraeus Noblelight America LLC, 2015, pp. 1-26.
Feng et al., "A stigmatic Ultraviolet-Visible Monochromator for Use with a High Brightness Laser Driven Plasma Light Source", Review of Scientific Instruments, vol. 84, 2013, pp. 1-6.
Fiedorowicz et al., "X-Ray Emission form Laser-Irradiated Gas Puff Targets," Appl. Phys. Lett., vol. 62, No. 22, May 31, 1993, pp. 2778-2780.
Fomenkov et al., "Laser Produced Plasma Light Source for EUVL", Cymer Inc., 17075 Thommint Court, San Diego, CA 92127, USA, 2011, pp. 1-6.
Franzen, "Continuous Laser-Sustained Plasmas", 1973, J. Appl. Phys., vol. 44, pp. 1727-1732.
Franzen, "CW Gas Breakdown in Argon Using 10.6-µm Laser Radiation," Appl. Phys. Lett., vol. 21, No. 2, Jul. 15, 1972, pp. 62-64.
Frey et al., "Spectroscopy and kinetics of the ionic cesium flouride excimer excited by a Laser-Produced Plasma", Journal of the Optical Society of America B, vol. 6, No. 8, 1989, pp. 1529-1535.
Fujimoto et al., "High Power InGaAs/AlGaAs laser Diodes with Decoupled Confinement Heterostructure", SPIE vol. 3628, 1999, pp. 38-45.
Galvanauskas, "Fiber laser based EUV lithography sources", Panel discussion presentation at the SEMATECH EUV Source Workshop (2007).
Geisler et al., "Spectrometer System Using a Modular Echelle Spectrograph and a Laser-Driven Continuum Source for Simultaneous Multi-Element Determination by Graphite Furnace Absorption Spectrometry", Spectrochimica Acta Part B, vol. 107, 2015, pp. 11-16.
Generalov et al., "Experimental Investigation of a Continuous 1972, pp. 763-769. Optical Discharge," Soviet Physics JETP, vol. 34, No. 4, Apr. 1972, pp. 763-769.
Gentile et al., "Oxidative Decontamination of Tritiated Materials Employing Ozone Gas", PPPL, 2002, pp. 1-9.
Gentile et al., "Tritium Decontamination of TFTR D-T Graphite Tiles Employing Ultra Violet Light and a Nd:YAG Laser", Japan Atomic Energy Research Institute, 1999, p. 321-322.
George et al., "13.5 nm EUV Generation from Tin-doped Droplets Using a Fiber Laser", Optics Express, vol. 15, No. 25, 2007, pp. 16348-356.
Girard et al., "Generating Conditions of a Laser-Sustained Argon Plasma Jet",J. Phys. D: Appl. Phys., vol. 26, 1993, pp. 1382-1393.
Glangetas, "New Design for a Microwave Discharge Lamp", Rev. Sci. Instrum., vol. 51, No. 3, 1980, pp. 390-391.
Griem, "Plasma Spectroscopy", 1964, pp. 172-176.
Gullikson et al., "A Soft X-Ray/EUV Reflectometer Based on a Laser Produced Plasma Source", Journal: Journal of X-Ray Science and Technology, vol. 3, No. 4, 1992, pp. 283-299.
Gwyn, "EVU Lithography Update: The timeline puts the screws to extreme ultraviolet lithography, but engineers rise to the challenge", SPIE, 2002, pp. 1-4.
Hadal et al., "Influence of Ambient Gas on the Temperature and Density of Laser Produced Carbon Plasma", Appl. Phys. Lett. vol. 72, No. 2, 1998, pp. 167-169.
Bakshaev et al., "Measurements of Neutron Emission from a Z-pinch Constriction", ISSN 1063-780X, Plasma Physics Reports, vol. 32. No. 7, 2006, pp. 531-538.
Bakshaev et al., "Study of the Plasma in a Preformed Z-pinch Constriction", Plasma Physics Reports, vol. 27, No. 12, 2001, pp. 1039-1047.
Bakshaev et al., "Theoretical and Experimental Study for Possibility of Nuclear Burn Wave Initiation in Z-Pinch due to M=0 Instability Development", Russian Research Center Kurchatov Institute, 1999, pp. 879-882.
International Preliminary Report on Patentability received for PCT Application No. PCT/US2023/081385 mailed on Jun. 19, 2025, 6 pages.
Office Action Received for Taiwan Patent Application No. 112147347, mailed on Aug. 12, 2025, 14 pages including 6 pages of English Translation.
Vikhrev et al., "Development of sausage-type instability in a Z-pinch plasma column", Nuclear Fusion, 1993, vol. 33, No. 2, pp. 311-321.
Vikhrev et al., "Neutron Generation from Z-Pinches", ISSN 1063-780X, Plasma Physics Report, vol. 33, No. 5, 2007, pp. 356-380.
Abe et al., "KrF Laser Driven Xenon Plasma Light Source of a Small Field Exposure Tool", Proc. Of SPIE, vol. 6151, 2006, pp. 61513T-1-61513T-5.
Agrawal et al., "Infrared And Visible Semiconductor Lasers", 1993, pp. xiii-616.
Agrawal et al., "Semiconductor Lasers", Second edition, 1993, p. 547.
Ahmed et al., "Laser Optogalvanic Spectroscopic Studies of Xenon", J. Phys. B: At. Mol. Opt. Phys. 31, 1998, pp. 4017-4028.
Aitoumeziane et al., "Theoretical and Numerical Study of the Interaction of a Nanosecond Laser Pulse with a Copper Target for Laser-Induced Breakdown Spectroscopy Applications", J. Opt. Soc. Am. B, vol. 31, No. 1, 2014, pp. 53-61.
Al-Muhanna et al., High-Power (>10 W) Continuous-Wave Operation from 100-um-Aperture 0.97-um-emitting Al-Free Diode Lasers, Applied Physics Letters, vol. 73, No. 9, Aug. 31, 1998, pp. 1182-1184.
Angel, "LIBS Using Dual-Laser Pulses", 2002, p. 14.
Apter, "High-power Diode Lasers Offer Efficient Answer, Product Guide", 2005, pp. 1-3.
Aragon et al., "Determination of Carbon Content in Molten Steel Using Laser-Induced Breakdown Spectroscopy", 1993, pp. 306-608.
Arieli, Excitation of Gas Laser by Optical Pumping, Chapter 6.1, Gas Laser, 2006, p. 2b.
Arp et al., "Argon Mini-Arc Meets its Match: Use of a Laser-Driven Plasma Source in Ultraviolet-Detector Calibrations", Applied Optics vol. 53, Issue 6 , 2014, pp. 1089-1093.
Arp et al., "Feasibility of Generating a Useful Laser-Induced Breakdown Spectroscopy Plasma on Rocks at High Pressure: reliminary Study for a Venus Mission", Spectrochimica Acta Part B 59, 2004, pp. 987-999.
Arzuov et al., Self-Maintenance of a Continuous Optical Discharge in Gases Near Solid Targets, Soy. J. Quant. Electron., vol. 5, No. 5, 1975, pp. 523-525.
Azuma et al., Debris from Tape-Target Irradiated with Pulsed YAG Laser, Applied Surface Science, 2002, pp. 224-228.
B 11 3mmaxoe, 011THLIECKHE PA3PFIRb1,110flREPK4BAEMbIE I4311YLIEHMEM J1A3EPOB Efill)KHEI-0 ilk-. I4-EIA11A3OHA Ommixo-xmknyeckasi Kmue-rma B ra3ouoii gmuamme, www.chemphys.edu.ru/pdf/2014-11-29-001.pdf.
B.B. Kostin, I4311YLIEH14EF1J1A3Mbl, HAIPETOC4 KOPOTKI4MI4 11A3EPHb1MI4 I4M11YIlbCAM14 23(2) 014314KA EflA3Mbl 118 (1997).
B.T. Apxpinkmu and A. K. Dona HEIII4HEOHAFI 011T14KA 14 11PEOBPA3OBAHHE CBETA B IA3AX 153(3) YalEXI4 IM3144ECK14X HAYK 423 (1987).
Babucke et al., "On the Energy Balance in the Core of Electrode-Stabilized High-Pressure Mercury Discharges", J. Phys. D: Appl. Phys. vol. 24, 1991, pp. 1316-1321.
Bachmann, "Goals and status of the German national research initiative BRIOLAS (brilliant diode lasers)",Proc. of SPIE vol. 6456, 2007, 645608-1.

(56) References Cited

OTHER PUBLICATIONS

Bachmann, "Industrial Applications of High Power Diode Lasers in Materials Processing", Applied Surface Science, 208-209, 2003, pp. 125-136.
Baer, "Plasma Diagnostics With Semiconductor Lasers Using Fluorescence And Absorption Spectroscopy", Stanford University ProQuest Dissertations Publishing, 1993, pp. 1-194.
Ball, "Raman Spectroscopy", vol. 17, No. 2, 2002, pp. 50-52.
Ballman et al., "Synthetic Quartz with High Ultraviolet Transmission", Applied Optics, vol. 7, No. 7, 1968, pp. 1387-1390.
Barnes et al., "Argon Arc Lamps", Applied Optics, vol. 24, No. 13, 1985, pp. 1947-1949.
Barnes et al., "High Power Diode Laser Cladding", Journal of Materials Processing Technology, vol. 138, 2003, pp. 411-416.
Bartz et al., "Optical Reflectivity Measurements Using a Laser Plasma Light Source", Appl. Phys. Lett. vol. 55, No. 19, 1989, pp. 1955-1957.
Bataller et al., "Nanosecond High-Power Dense Microplasma Switch for Visible Light",Applied Physics Letters, vol. 105, 2014, pp. 1-5.
Bauder, Radiation from High-Pressure Plasmas, Journal of Applied Physics, vol. 39, No. 1, 1968, pp. 148-152.
Beam Samplers; UV Fused Silica Beam Samplers, (AR Coating: 250-420 nm) (AR Coating: 350-700 nm) (AR Coating: 550-1050 nm) (AR Coating: 1050-1700 nm), 3 pages.
Beck, "Simple Pulse Generator for Pulsing Xenon Arcs with High Repetition Rate," Rev. Sci. Instrum., vol. 45, No. 2, Feb. 1974, pp. 318-319.
Belasri et al., "Electrical Approach of Homogenous High Pressure NelXe/CHI Dielectric Barrier Discharge for XeCl (308 nm) Lamp", Plasma Chem Plasma Process, vol. 31, 2011, pp. 787-798.
Bloch et al., "Field Test of a Novel Microlaser-Based Probe for in Situ Fluorescence Sensing of Soil Contamination", Applied Spectroscopy, vol. 52, No. 10, 1998, pp. 1299-1304.
Bogaerts et al., "Gas Discharge Plasmas and their Applications", Spectrochimica Acta Part B 57, 2001, pp. 609-658.
Bolshov et al., "Investigation of the Dynamic of an Expanding Laser Plume by a Shadowgraphic Technique", Spectrochimica Acta Part B 63, 2008, pp. 324-331.
Borghese et al., "Time-Resolved Spectral and Spatial Description of Laser-Induced Breakdown in Air as a Pulsed, Bright, and Broadband Ultraviolet—Visible Light Source", Applied Optics, vol. 37, No. 18, Jun. 20, 1998, pp. 3977-3983.
Brauch et al., "High-Power Diode Lasers for Direct Applications", Topics Appl. Phys., vol. 78, 1000, pp. 303-368.
Breton et al., "Vacuum-UV Radiation of Laser-Produced Plasmas", Journal of the Optical Society Of America, vol. 63, No. 10, 1973, pp. 1225-1232.
Bridges et al., "Investigation of a Laser-Produced Plasma VUV Light Source", Applied Optics, vol. 25, No. 13, Jul. 1, 1986, pp. 2208-2214.
Bridges, "Characteristics of an Opto-Galvanic Effect in Cesium and Other Gas Discharge Plasmas", J. Opt. Soc. Am., vol. 68, No. 3, Mar. 1978, pp. 352-360.
Bussiahn, R., et al., "Experimental and theoretical investigations of a low-pressure He—Xe discharge for lighting purpose," Journal of Applied Physics, vol. 95, No. 9, May 1, 2004, pp. 4627-4634.
Byer, "Laser-Produced Plasmas: A Compact Soft X-Ray Source with High Peak Brightness", Defence Technical Information Centre, 1989, pp. 1-26.
C10T/C6 Lightshield System Parts Listing, Heraeus Noblelight America LLC, 2015, pp. 1-8.
Cann, "Light Sources in the 0.15-20-μ Spectral Range", Applied Optics, vol. 8, No. 8, 1969, pp. 1645-1661.
Carlhoff et al., "Continuous Optical Discharges at Very High Pressure," Physica 103C, 1981, pp. 439-447.
Carlhoff et al., "High Pressure Optical Discharges", Journal of Physics, 1979, pp. 757-758.
Cedolin et al., "Laser-Induced Fluorescence Measurements of Resonance Broadening in Xenon", Physical Review A, vol. 54, No. 1, 2006, pp. 335-342.
Cedolin, "Laser-Induced Fluorescence Diagnostics Of Xenon Plasmas", 1997, pp. 1-96.
Cermax lamps, including models LX300F, LX1000CF, EX300-10F, EX500-13F, EX900C-10F, EX900C-13F, EX1000C-13F, LX125F, LX175F, LX500CF, EX125-10F, EX175-10F, EX500-10F,EX1000C-10F, EX900-10F; PerkinElmer Optoelectronics.
Cesar et al., "High-power fibre lasers", Nature Photonics, vol. 7, 2013, pp. 861-867.
Chang et al., "Fiber Laser Driven EUV Generation", Conference on Lasers and Electro-Optics, 2005, pp. 2200-2202.
Kopecek et al., "Laser-Induced Ignition of Methane-Air Mixtures at Pressures up to 4 MPa", Laser Physics, vol. 13, No. 11, 2003, pp. 1365-1369.
Korn et al., "Ultrashort 1-kHz Laser Plasma Hard X-ray Source", Optics Letters, vol. 27, No. 10, 2002, pp. 866-868.
Kozlov et al., "Radiative Losses by Argon Plasma and the Emissive Model of a Continuous Optical Discharge", Soy. Phys. JETP, vol. 39, No. 3, Sep. 1974, pp. 463-468.
Kozlov et al., "Sustained Optical Discharges in Molecular Gases," Sov. Phys. Tech. Phys. vol. 49, No. 11, Nov. 1979, pp. 1283-1287.
Kranzusch et al., "Spatial Characterization of Extreme Ultraviolet Plasmas Generated by Laser Excitation of Xenon Gas Targets", Review of Scientific Instruments, vol. 74, No. 2, 2003, pp. 969-974.
Krushelnick et al., "Plasma Channel Formation and Guiding during High Intensity Short Pulse Laser Plasma Experiments", Physical Review Letters, vol. 78, No. 21, 1997, pp. 4047-4050.
Ku et al., "Decay of Krypton 1(s)(2) and 1(s)(3) Excited Species in the Late Afterglow", Physical Review A, vol. 8, No. 6, 1973, pp. 3123-3130.
Kubiak et al., "Scale-up of a Cluster Jet Laser Plasma Source for Extreme Ultraviolet Lithography", SPIE, vol. 3676, 1999, pp. 669-678.
Kuhn, "Laser Engineering", 1998, pp. 303-343, 365-377, 384-440.
Kurkov et al., "CW Medium-Power Fiber Lasers for Near IR Range", Proceedings of SPIE, vol. 5449, 2004, pp. 62-69.
Lackner et al., "The Optical Spark Plug: Window-related Issues", Institute of Chemical Engineering, Vienna University of Technology, 2005, pp. 1-6.
Lange et al., "Tunable Diode Laser Absorption Spectroscopy for Plasmas at Elevated Pressures", Proceedings of SPIE vol. 4460, 2002, pp. 177-187.
Laufer et al., "Effect of Temperature on the Vacuum Ultraviolet Transmittance of Lithium Fluoride, Calcium Fluoride, Barium Fluoride, and Sapphire", Journal of The Optical Society of America, vol. 55, No. 1, 1965, pp. 64-66.
Laufer, "Introduction To Optics And Lasers In Engineering", 1996, pp. 449-454.
Legall et al., "Spatial and Spectral Characterization of a Laser Produced Plasma Source for Extreme Ultraviolet Metrology", Review of Scientific Instruments, vol. 75, No. 11, 2004, pp. 4981-4988.
Lenses and Curved Mirrors, University of Delaware, Imaging (last visited Dec. 19, 2015), pp. 24-29.
Leonov et al., "Mechanisms of Resonant Laser Ionization", JETP, vol. 8, No. 4, 1997, pp. 703-715.
Lewis et al., "Measurements of CW Photoionization for the Use in Stable High Pressure Tea Laser Discharge", IEEE Nuclear and Plasma Sciences Society, 1975, pp. 14-45.
Li et al., "Density measurements of a high-density pulsed gas jet for laser-plasma interaction studies", Meas. Sci. Technol., vol. 5, 1994, pp. 1197-1201.
Li, "The Advances and Characteristics of High-Power Diode Laser Materials Processing", Optics and Lasers in Engineering, vol. 34, 2000, pp. 231-253.
Liao et al., "An efficient Ni Kα X-ray Source Driven by a High Energy Fiber CPA System", Center for Ultrafast Optical Science, 2007, pp. CP1-4-THU.
Liao et al., "Generation of Hard X-rays Using an Ultrafast Fiber Laser System", Optics Express, vol. 15, No. 21, 2007, pp. 13942-13948.
Light Hammer, 10 Mark II UV Lamp System, Heraeus Noblelight America LLC, 2015, pp. 1-20.
Light Hammer, 6 UV Lamp System Parts Listing, Heraeus Noblelight America LLC, 2015, pp. 1-22.

(56) References Cited

OTHER PUBLICATIONS

Lo et al., "Resonance-Enhanced LIBS", Department of Physics, 2002, pp. 15-17.
Lowe et al., "Developments in Light Sources and Detectors for Atomic Absorption Spectroscopy", Spectrochimica Acta Part B., vol. 54, 1999, pp. 2031-2039.
Lui et al., "Resonance-Enhanced Laser-Induced Plasma Spectroscopy: Time-Resolved Studies and Ambient Gas Effects", Department of Physics, 2002, pp. 19-21.
Luo et al., "Sapphire (0 0 0 1) Surface Modifications Induced by Long-Pulse 1054 nm Laser Irradiation", Applied Surface Science, vol. 253, 2007, pp. 9457-9466.
MacDowell et al., "Reduction imaging with soft x rays for projection lithography", Review Of Scientific Instruments, vol. 63, No. 1, 1992, pp. 737-740.
Maclean et al., "Direct Diode Laser Pumping of a Ti:Sapphire Laser", Institute of Photonics, SUPA, 2009, pp. 1-3.
Magner et al., "Self-Compression of Ultrashort Pulses through Ionization-Induced Spatiotemporal Reshaping", Physical Review Letter, vol. 93, No. 17, 2004, pp. 173902-1-173902-4.
Mahmoud et al., "Ion Formation in Laser-Irradiated Cesium Vapor", Journal of Quantitative Spectroscopy & Radiative Transfer, vol. 102, 2006, pp. 241-250.
Malik et al., "Spectroscopic Measurements on Xenon Plasma in a Hollow Cathode", 2000, J. Phys. D: Appl. Phys., vol. 33, pp. 2037-2048.
Malka et al., "Channel Formation in Long Laser Pulse Interaction with a Helium Gas Jet", Physical Review Letters, vol. 79, No. 16, 1997, pp. 2979-2982.
Mandel'shtam et al., "Investigation of the Spark Discharge Produced in Air by Focusing Laser Radiation II", Soviet Physics JETP, vol. 22, No. 1, 1966, pp. 91-96.
May, "Infrared Optogalvanic Effects in Xenon", Optics Communications, vol. 64, No. 1, 1987, pp. 36-40.
Mazumder et al., "Spectroscopic Studies of Plasma During CW Laser Gas Heating in Flowing Argon", J. Appl. Phys., vol. 62, No. 12, 1987, pp. 4712-4718.
Measures et al., "Fast and Efficient Plasma Heating Through Superelastic Laser Energy Conversion", J. Appl. Phys., vol. 51, No. 7, 1980, pp. 3622-3628.
Measures et al., "Laser interaction based on resonance saturation (LIBORS): an alternative to inverse bremsstrahlung for coupling laser energy into a plasma", 1979, Applied Optics, vol. 18, No. 11, pp. 1824-1827.
Measures et al., "TABLASER: Trace (Element) Analyzer Based on Laser Ablation and Selectively Excited Radiation", Applied Optics, vol. 18, No. 3, 1979, pp. 281-286 (1979).
Measures, "Electron Density and Temperature Elevation of a Potassium Seeded Plasma by Laser Resonance Pumping",J. Quant. Spectrose. Radial. Transfer. vol. 10, 1970, pp. 107-125.
Mercury Vapor Light Source, Model OS-9286A.
Michel et al., "Analysis of Laser-Induced Breakdown Spectroscopy Spectra: The Case for Extreme Value Statistics", Spectrochimica Acta Part B, vol. 62, 2007, pp. 1370-1378.
Michel et al., "Laser-Induced Breakdown Spectroscopy of Bulk Aqueous Solutions at Oceanic Pressures: Evaluation of Key Measurement Parameters", Applied Optics, vol. 46, No. 13, 2007, pp. 2507-2515.
Milian et al., "Dynamic Compensation of Chromatic Aberration in a Programmable Diffractive Lens", Optical Express, vol. 14, No. 20, 2006, pp. 9103-9112.
Millard et al., "Diode Laser Absorption Measurements of Metastable Helium in Glow Discharges", Plasma Sources Sci. Technol., vol. 7, 1998, pp. 288-394.
Mills et al., "Argon-Hydrogen-Strontium Discharge Light Source", IEEE Transactions On Plasma Science, vol. 30, No. 2, 2002, pp. 639-652.
Mills et al., "Excessively Bright Hydrogen-Strontium Discharge Light Source Due to Energy Resonance of Strontium with Hydrogen", J. Plasma Physics, vol. 69, Part 2, 2003, pp. 131-158.
Mizoguchi et al., "Development of Light Source for Lithography at Present and for the Future", vol. 59, No. 166, 2013, pp. 1-7.
Mizoguchi et al., Development of CO2 Laser Produced Xe Plasma EUV Light Source for Microlithography, Proc. Of SPIE, vol. 6151, 2006, pp. 61510S-1.
Schohl et al., "Absolute Detection of Metastable Rare Gas Atoms by a CW Laser Photoionization Method", Z. Phys. D—Atoms, Molecules and Clusters, vol. 21, 1991, pp. 25-39.
Jin et al., New Laser Plasma Source for Extreme-Ultraviolet, 1995, pp. 2256-2258.
Shaw et al., "Preliminary Design of Laser-Induced Breakdown Spectroscopy for Proto-Material Plasma Exposure Experiment", Review Of Scientific Instruments, vol. 85, 2014, pp. 11D806-1-11D806-3.
Shen et al., "Highly Efficient Er, Yb-Doped Fiber Laser with 188W Free-Running and >100W Tunable Output Power", Optics Express, vol. 13, No. 13, 2005, pp. 4916-4921.
Shigeyoshi et al., "Near Infrared Absorptions of Neon, Argon, Krypton, and Xenon Excited Diatomic Molecules", J. Chem. Phys., vol. 68, 1978, pp. 7595-4603.
Shimada et al., "Characterization of Extreme Ultraviolet Emission from Laser-Produced Spherical Tin Plasm Generated with Multiple Laser Beams", Applied Physics Letters, vol. 86, 2005, pp. 051501-1-051501-3.
Shirakawa et al., "CW 7-W, 900-nm-wide Supercontinuum Source by Phosphosilicate Fiber Raman Laser and Highnonlinear Fiber", Proceedings of SPIE, vol. 5709, 2005, pp. 199-205.
Sidawi, "Fiber Lasers Gain Power", www.rdmag.com, 2003, p. 26.
Silfvast et al., "Comparison of Radiation from Laser-Produced and DC-Heated Plasmas in Xenon", Applied Physics Letters, vol. 25, No. 5, 1974, pp. 274-277.
Silfvast, Laser Fundamentals, Schhol of Optics, 2004, pp. 1-6, pp. 199-222 & 565-68.
Skenderovic et al., "Laser-ignited glow discharge in lithium vapor", Physical Review A, vol. 62, 2000, pp. 052707-1-052707-7.
Smith, "Gas-Breakdown Dependence on Beam Size and Pulse Duration with 10.6-μ. Wavelength Radiation", Applied Physics Letters, vol. 19, No. 10, 1971, pp. 405-408.
Snyder et al., "Laser-Induced Breakdown Spectroscopy of High-Pressure Bulk Aqueous Solutions", Applied Spectroscopy, vol. 60, No. 7, 2006, pp. 786-790.
Sobota et al., "The Role of Metastables in the Formation of an Argon Discharge in a Two-Pin Geometry", IEEE Transactions on Plasma Science, vol. 38, No. 9, 2010, pp. 2289-2299.
Song et al., "Mechanisms of Absorption in Pulsed Excimer Laser-Induced Plasma", Appl. Phys. A, vol. 65, 1997, pp. 477-485.
Stamm, "Extreme Ultraviolet Light Sources for use in Semiconductor Lithography—State of the Art and Future Development", J. Phys. D: Appl. Phys., vol. 37, 2004, pp. 3244-3253.
Stulen et al., "Developing A Soft X-Ray Projection Lithography Tool", AT & T Technical Journal, 1991, pp. 37-48.
Su et al., "Note: A Transient Absorption Spectrometer Using an Ultra Bright Laser-Driven Light Source", Review Of Scientific Instruments, vol. 84, 2013, pp. 086106-1-386106-3.
Sundvold et al., "Optical Firing System", Proc. Of SPIE, vol. 5871, 2005, pp. 587104-1-587104-10.
Super-Quiet Xenon Lamp Super-Quiet Mercury-Xenon Lamp, Hamamatsu Product Information, Nov. 2005, 16 pages.
Surzhikov, "Numerical Simulation of Subsonic Gasdynamical Instabilities Near Heat Release Regions", AIAA, 1996, pp. 1-11.
Generalov et al., "Continuous Optical Discharge," ZhETF Pis. Red. 11, No. 9, May 5, 1970, pp. 302-304.
Szymanski et al., "Nonstationary Laser-Sustained Plasma", Journal of Applied Physics, vol. 69, No. 6, 1990, pp. 3480-3484.
Szymanski et al., "Spectroscopic Study of a Supersonic Jet of Laser-Heated Argon Plasma", J. Phys. D: Appl. Phys., vol. 30, 1997, pp. 998-1006.
Takahashi et al., "Numerical Analysis of Ar(2) Excimer Production in Laser-Produced Plasmas", Journal of Applied Physics, 1998, pp. 390-393.
Takahashi et al.,"Ar(2) Excimer Emission from a Laser-Heated Plasma in a High-Pressure Argon Gas", Applied Physics Letters, vol. 77, No. 5, 2000, pp. 4115-4117.

(56) References Cited

OTHER PUBLICATIONS

Tam et al., "Plasma Production In a Cs Vapor by a Weak cw Laser Beam at 6010 A, Optics Communications", vol. 21, No. 3, 1977, pp. 403-407.
Tam, "Dynamic Response of a cw Laser-produced Cs Plasma to Laser Modulations", Appl. Phys. Lett., vol. 35, No. 9, 1979, pp. 683-685.
Tam, "Quasiresonant Laser-Produced Plasma: An Efficient Mechanism for Localized Breakdown", J. Appl. Phys., vol. 51, No. 9, 1980, pp. 4682-4687.
Tanaka et al., "Production of Laser-Heated Plasma in High-Pressure Ar Gas and Emission Characteristics of Vacuum Ultraviolet Radiation from Ar(2) Excimers", Appl. Phys. B, vol. 74, 2002, pp. 323-326.
Tansu, "Novel Quantum-Wells GaAs-Based Lasers for All Transmission Windows in Optical Communication", 2003, pp. i-291.
Theriault et al., "A Real-Time Fiber-Optic LIBS Probe for the In Situ Delineation of Metals in Soils", Field Analytical Chemistry and Technology, vol. 2, No. 2, 1998, pp. 117-125.
Theriault et al., "Field Deployment of a LIBS Probe for Rapid Delineation of Metals in Soils", SPIE, vol. 2835, 1996, pp. 83-88.
Thermoelectric Cooler Controller, Analog Devices Inc., 2002, pp. 1-24.
Tichenor et al., "Soft-x-ray projection lithography experiments using Schwarzschild imaging optics", Applied Optics, vol. 32, No. 34, 1993, pp. 7068-7071.
Tombelaine, et al. "Spectrally Shaped Light From Supercontinuum Fiber Light Sources", Optics Communications, vol. 284, Issue 7, Apr. 1, 2011, pp. 1970-1974.
Tooman, "The Sandia Laser Plasma Extreme Ultraviolet and Soft X-ray (XUV) Light Source", SPIE vol. 664, 1986, pp. 186-191.
Topanga Advanced Plasma Lighting APL1000-4000SF, p. 1.
Topanga Advanced Plasma Lighting APL1000-5000SF, p. 1.
Topanga Advanced Plasma Lighting APL250-4000BF, p. 1.
Topanga Advanced Plasma Lighting APL250-4000SF, p. 1.
Topanga Advanced Plasma Lighting APL250-5500SF, p. 1.
Topanga Advanced Plasma Lighting APL400-4000BF, p. 1.
Topanga Advanced Plasma Lighting APL400-4000SF, p. 1.
Topanga Advanced Plasma Lighting APL400-5500BF, p. 1.
Topanga Advanced Plasma Lighting APL400-5500SF, p. 1.
Topanga's Advanced Plasma Lighting System, Topanga USA, 2016, pp. 1-5.
Treshchalov et al., "Spectroscopic Diagnostics of Pulsed Discharge in High-Pressure Argon", Quantum Electrics, vol. 40, No. 3, 2010, pp. 234-240.
Tsuboi et al., "Nanosecond Imaging Study on Laser Ablation of Liquid Benzene", Appl. Phys. Lett, vol. 64, 1994, pp. 2745-2747.
Uhlenbusch, et al., "Hβ-Line Profile Measurements in Optical Discharges", J. Quant. Spectrosc. Radiat. Transfer vol. 44, No. 1, 1990, pp. 47-56.
Notice of Allowance Received for Taiwan Patent Application No. 112147347, mailed on Mar. 2, 2026, 3 pages including 1 page of English Translation.
Office Action Received for Japanese Patent Application No. 2025-502390, mailed on May 12, 2026, 13 pages including 6 pages of English Translation.

* cited by examiner

INDUCTIVELY COUPLED PLASMA LIGHT SOURCE WITH DIRECT GAS INJECTION

The section headings used herein are for organizational purposes only and should not be construed as limiting the subject matter described in the present application in any way.

INTRODUCTION

Numerous commercial and academic applications have a need for high brightness light in the extreme ultra-violet (EUV) region of the spectrum. For example, EUV light is needed for numerous industrial applications, including photolithography, metrology, accelerated life testing, photoresist development and testing, defect inspection, and microscopy. Other applications for EUV light include spectroscopy, aerial imaging, and blank mask inspection. These and other applications require EUV sources that have high reliability, small physical size, low fixed cost, low operating cost, flexible operating space to optimize the operation to the desired application and low complexity. Known ultra-violet light sources have limited performance and usefulness in the extreme ultra-violet (EUV) region of the spectrum because of various engineering difficulties.

SUMMARY

An ultraviolet light source with direct feed gas injection includes a chamber comprising a plasma confinement region and defining an aperture adjacent to the plasma confinement region that passed light generated by the plasma. A magnetic core is positioned around the plasma confinement region and is configured to generate a plurality of plasma current loops that converges in the plasma confinement region during operation. A high voltage region is coupled to the plasma confinement region. An exhaust port is configured to be coupled to a pump that controls a pressure in the chamber. In various configurations, a butterfly valve or other means of controlling gas conductance can be used as well as a gas controller and a variable speed vacuum pump.

A feed gas injector is coupled to a gas port in the chamber and has an output that is positioned proximate to a boundary of the plasma confinement region so that the feed gas injector provides a feed gas to the plasma confinement region that creates a differential pressure in the plasma confinement region. The feed gas injector can include a plurality of apertures that provide the feed gas into plasma confinement region. In various configurations, the output of the feed gas injector is positioned within 1 cm or within ½ cm of the boundary of the plasma confinement region. In some configurations, the output of the feed gas injector is positioned between the low voltage region and the high voltage region of the chamber.

The feed gas injector can be positioned and configured so that, during operation, a desired ratio of pressure in the plasma confinement region to pressure in the chamber proximate to the exhaust port is maintained during operation. Also, the feed gas injector can be positioned and configured so that during operation substantially all feed gas flows through the plasma confinement region before passing into the exhaust port. Also, the feed gas injector can be positioned and configured so that during operation, the gas injector injects gas into the plasma confinement region at times that refill the plasma confinement region after pinch expansion.

In some configurations, a second gas injector is included with an output that is positioned proximate to a second boundary of the plasma confinement region. The second gas injector is coupled to a second port in the chamber and can be configured to pass feed gas or another type of gas. In some configurations, the second gas injector can be configured to inject gas into the chamber at a location that provides a desired amount of back flow of gas into the plasma confinement region after formation of a pinch expansion in the plasma confinement region. Also, the second gas injector can be positioned to inject gas into the chamber so as to reduce self-absorption of the feed gas outside of the plasma confinement region.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings described below are for illustration purposes only. The drawings are not necessarily to scale; emphasis is instead generally being placed upon illustrating principles of the teaching. The drawings are not intended to limit the scope of the Applicant's teaching in any way.

DESCRIPTION OF VARIOUS EMBODIMENTS

Figure 1:
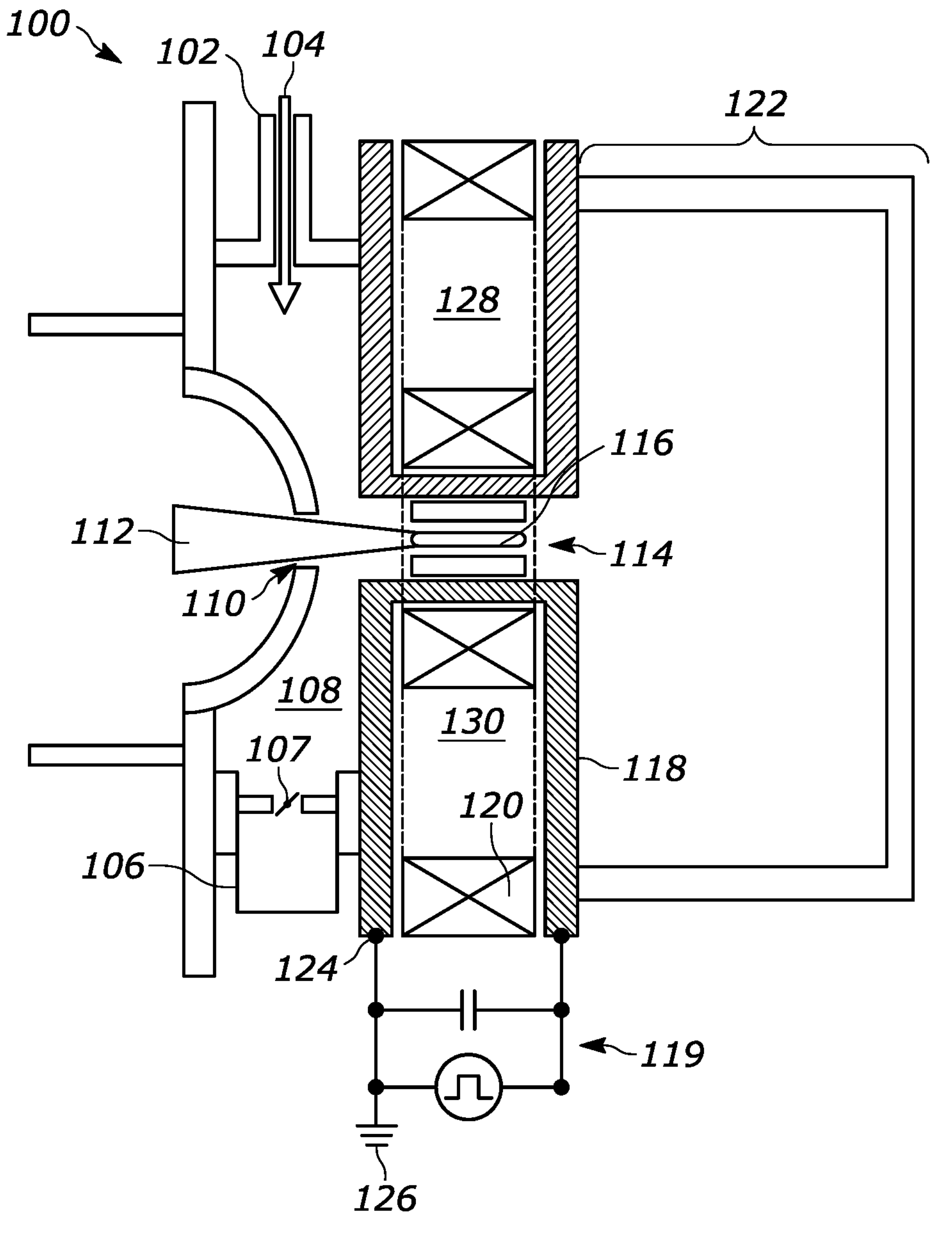
PRIOR ART FIG. 1
FIG. 1 illustrates a known plasma chamber for generated a Z-pinch ultraviolet light.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications, and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

Extreme ultraviolet (EUV) light sources play an important role in numerous optical measurement and exposure applications. It is desirable that these sources be configured to accommodate numerous use cases. One challenge is to generate high-power and high-brightness EUV light in a configuration that allows integration with numerous applications and also exhibits high stability and high reliability.

Extreme ultraviolet radiation is referred to in numerous ways by those skilled in the art. Some skilled in the art sometimes referred to extreme ultraviolet radiation as high-energy ultraviolet radiation, which can be abbreviated as EUV. Extreme ultraviolet radiation generally refers to electromagnetic radiation that is part of the electromagnetic spectrum nominally spanning wavelengths from 124 nm to 10 nm. There is some overlap between extreme ultraviolet radiation and what is considered to be the optical spectrum. One particular EUV wavelength of interest is 13.5 nm because that wavelength is commonly used for lithography. Extreme ultraviolet radiation sources, according to the present teaching, are not limited to the generation of EUV radiation. As is known in the art, plasmas can be used to generate a wide spectral range of photons. For example, plasmas generated according to the present teaching can also be used to generate soft x-ray photons (SXR). This includes, for example, photons with wavelengths of less than 10 nm.

So-called Z-pinch plasmas, which have current in the axial direction, have been shown to be effective at producing EUV and SXR light. However, most known sources have employed electrodes to conduct high discharge currents into the plasma. These electrodes, which are typically in contact with high temperature plasma, can melt and produce significant debris, which is highly undesirable as it can greatly reduce the useful lifetime of the source.

Electrodeless approaches to generated EUV are desirable and fill a considerable market need. Such sources are available, for example, from Energetiq, a Hamamatsu Company, located in Wilmington, MA. These sources are based on a Z-pinch plasma, but avoid electrodes entirely by inductively coupling current into the plasma. The plasma in these EUV sources is magnetically confined away from the source walls, minimizing the heat load and reducing debris and providing excellent open-loop spatial stability, and stable repeatable power output. One challenge with known Z-pinch light sources is that their performance, especially in brightness, is limited by their power supplies because they use magnetic switches, which are highly undesirable One feature of the EUV sources of the present teaching is that they are versatile and support various applications with high brightness. In particular, EUV sources of the present teaching improve upon known Z-pinch designs because they can be optimized for desired power and/or for desired brightness as required by the user for a particular application. In addition, EUV sources of the present teaching have a more compact physical foot print and a more flexible component layout.

FIG. 1 illustrates a known plasma chamber 100 for generating a Z-pinch ultraviolet light. See, for example, U.S. patent application Ser. No. 17/676,712, entitled "Inductively Coupled Plasma Light Source", which is assigned the present assignee. The entire contents of U.S. patent application Ser. No. 17/676,712 are incorporated herein by reference.

The chamber 100 includes an interface 102 that passes a feed gas 104 into the chamber 100. A pump 106 is used to evacuate the chamber region 108 to the desired operating pressure. The desired operating pressure in the chamber region 108 can be achieved by controlling the amount of gas fed into the chamber, by controlling the flow conductance of the gas into the pump, and/or by controlling the pump rate of the pump itself. For example, a butterfly valve 107 or other means of controlling gas conductance can be used as well as a gas controller and a variable speed vacuum pump. A port 110 is provided to pass EUV radiation 112 generated by the EUV plasma.

In various systems, the port 110 is configured to be adaptable for a user to attach to an application system (not shown) where the EUV radiation passes directly through the port 110. A plasma generation region 114 defines a plasma confinement region 116. The plasma confinement region 116 is formed by magnetic induction when a pulse forming and power delivery system 118 provides a current that interacts both actively and passively with magnetic cores 120, 121. A high voltage region 122 is attached to the plasma generation region 114. A grounded region 124 has an outer surface that is coupled to ground 126. A pulsed power supply 119 is electrically coupled to the power delivery system 118. The chamber 100 also includes regions 128, 130 to position magnet cores 120, 121 that provide inductive current flow for the chamber 100 in operation.

During operation of the Z-pinch plasma in this known chamber 100, the feed gas in the plasma generating region 114 is compressed by the electric pulses generated by the pulsed power supply 119, followed by an expansion of the gas after the pulse. During the compression and expansion some feed gas is lost from the plasma generating region 114 and must be replaced. This is accomplished in known EUV Z-pinched plasma light sources by simply allowing gas migrating into the plasma generating region from the area surrounding the plasma generating region.

One aspect of the present teaching is the realization that the slow replenishment of gas into the plasma generating region from the area surrounding the plasma generating region in known EUV Z-pinched plasma light sources severely limits the performance of known EUV Z-pinched plasma light sources. Another aspect of the present teaching is the understanding that the performance of known extreme ultraviolet radiation sources that use Z-pinched plasmas can be greatly improved by using a direct gas feed system and method to inject feed gas directly into the plasma generating region so that there are no significant time delays in replenishing gas into the plasma generation region when needed to achieve the desired light source performance or to at least create operating conditions that are not feed gas limited.

Such direct gas feeding into the plasma generating region can be accomplished by providing a separate gas tube structure or an integrated tunnel structure that delivers gas directly from a gas source through the chamber to a region that is in contact or that is in close proximity with a boundary of the plasma generating region without gas leakage. In various embodiments, the gas tube structure comprises one or a plurality of apertures that provide feed gas to the plasma generating region. Also, in various embodiments, the plasma generating region and the structure surrounding it may be split in separate sections that are spaced apart to allow the target gas to enter the plasma generating region in the gap between the sections. The result is that the target gas used in the process is forced to enter the chamber directly through the plasma generating region. This feature of the present teaching allows operation at pulse rates that would otherwise be prohibited by the slow migration of gas back into the plasma generating region after a Z-pinch compression.

Figure 2:
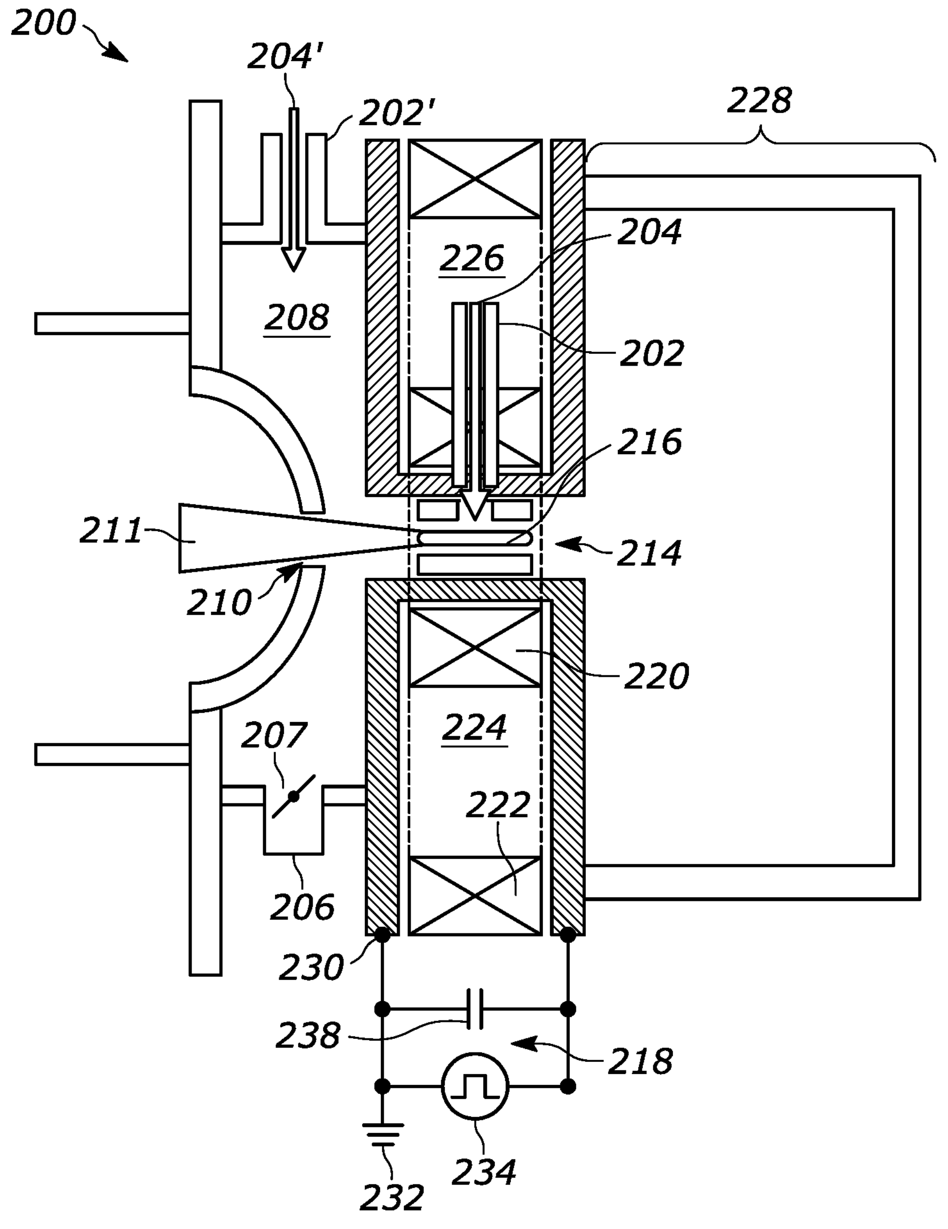
FIG. 2 illustrates a plasma chamber for generating a Z-pinch ultraviolet light according to the present teaching.

FIG. 2 illustrates a plasma chamber 200 for generating a Z-pinch ultraviolet light according to the present teaching. The chamber 200 is similar to the chamber 100 described in connection with FIG. 1, however, the chamber 200 includes a direct gas feeding apparatus according to the present teaching. The chamber 200 includes an interface 202 that passes a feed gas 204 into the chamber 200. The interface 202 can be a gas tube structure that is separate from the chamber 200 or can be an integrated tunnel structure that is formed directly in the chamber 200. The interface 200 delivers gas directly from a gas source through the chamber 200 to a region that is in contact or that is in close proximity with a boundary of the plasma generating region without gas leakage.

Some embodiments include a second interface 202' that passes feed gas 204' and/or a second gas into the chamber a second location. A pump 206 is used to evacuate the chamber region 208 to the desired operating pressure. The desired operating pressure in the chamber region 208 can be achieved by controlling the amount of gas fed into the chamber, by controlling the flow conductance of the gas into the pump, and/or by controlling the pump rate of the pump itself. For example, a butterfly valve 207 or other means of controlling gas conductance can be used as well as gas controller and a variable speed vacuum pump.

A port 210 is provided to pass EUV radiation 211 generated by the EUV plasma. The port 210 can include an EUV output port that passes the desired EUV radiation and substantially blocks other wavelengths of radiation. The port 210 can be configured to include a filter structure that blocks undesired radiation. In some embodiments, the port 210 is configured to be opaque to visual light. For example, in various embodiments, the EUV transparent port 210 is an aperture that can include a spectral purifying foil. Typically, the port 210 is a beamline aperture port that passes radiation propagating along the beamline. The port 210 can also be configured to have a desired diameter so as to physically block light propagating in certain directions. Furthermore, the diameter of an aperture that defines the port 210 can be chosen to provide a desired pressure differential between the outside and inside of the chamber 200.

In various systems, the port 210 is configured to be adaptable for a user to attach to an application system (not shown) where the EUV radiation passes directly through the port 210. A plasma generation region 214 defines a plasma confinement region 216. The plasma confinement region 216 is formed by magnetic induction when a pulse forming and power delivery section 218 provides a current that interacts both actively and passively with magnetic cores 220, 222 that are positioned in regions 224, 226 so that inductive current flows in the chamber 200 during operation. The magnetic confinement of the plasma in the plasma confinement region 216 is beneficial because the plasma is kept away from the components in the chamber 210, causing less erosion and associated contamination, which improves reliability and stability for the light source.

A high voltage region 228 is attached to the plasma generation region 214. A grounded region 230 has an outer surface that is coupled to ground 232. A pulsed power supply 234 is electrically coupled to the power delivery section 218 that is coupled to the high voltage region 228 and to the grounded region 230. The pulsed power supply 234 includes a parallel connected capacitor 238. In many embodiments, the capacitor 238 is a bank of multiple capacitors. The pulse generator 234 applies negative high-voltage pulses across the capacitor 238 and drives a current through the power delivery section 218 to ground 226.

Thus, the power delivery section 218 of the chamber 200 has a high voltage side 228 and a ground side 230. At least three inductively coupled plasma loops (not shown) are formed from the current pulses flowing through power delivery section 218 that interact both actively and passively with magnetic cores 220, 221. The plasma loops converge in the plasma generation region 214 that forms a magnetically confined Z-pinch. The plasma loops flow through the region between the inner core 220 and outer core 222 and through the plasma generation region 214.

One skilled in the art will appreciate that there are numerous methods of generating ultraviolet light according to the present teaching. These methods generally provide a feed gas to a boundary of the plasma confinement region in a plasma chamber. The feed gas is provided to the interface 202 that directly injects the feed gas 204 into the chamber 200 at the boundary of the plasma generation region 214. In some methods of operation, the feed gas is Xenon. In some methods of operation, the feed gas is Argon, Nitrogen, Neon, Helium, or a combination of gases that have light emission at the desired wavelength. Also, in some methods of operation, the mixture of feed gases is chosen so that the gas mixture provides desired light emission characteristics or increased optical power stability. For example, it can be beneficial to introduce Helium into the chamber to improve pinch stability without diluting the target gas in the plasma generating region. Introduction of a second gas or additional gases in the chamber may also further reduce self-absorption in the chamber.

It should be understood that some methods also apply feed gas and/or other gases to the second interface 202' positioned at one or more of various locations in the chamber 200, such as adjacent to the plasma generating region but not at a boundary.

The pulse power supply 234 generates voltage pulses. A train of voltage pulses is applied to at least one capacitor 238 electrically connected across an outer magnetic core 222 surrounding an inner magnetic core 220 that is positioned around the plasma confinement region 214. The outer core 222 eventually saturates, driving the impedance to zero. That is, the voltage pulses cause the at least one capacitor 238 to charge so that the outer magnetic core 222 saturates resulting in the capacitor(s) discharging causing the inner core 220 to couple the current pulse to the plasma loops, which results in a large pulse in plasma current driving the Z-pinch. During the charging time, a small leak current from the cores 220, 222 sustains the plasma loops. The Z-pinch operation requires a sustained loop, because it requires continuous ionized gas for proper function.

During operation of the Z-pinch plasma in chamber 200, the feed gas in the plasma generating region 214 is compressed by the electric pulses generated by the pulsed power supply 234, followed by an expansion of the gas after the pulse. In contrast to known chambers for producing EUV light, during the pulse compression and expansion, feed gas is provided directly to the plasma generating region 214 with a flow rate and volume that provides sufficient feed gas to replenish feed gas lost from pulse compression to form the Z-pinched plasma. Importantly, with the configuration shown in FIG. 2, no gas flows directly from the feed gas inlet 204 to the vacuum pump 206 without passing through the plasma generating region.

As a result, the plasma generation region 214 produces and emits nearly 100% of the EUV radiation produced by the plasma. The plasma loops themselves do not produce EUV light. The result is that the source 200 produces a high quality, relatively compact source of EUV light from a well-defined and stable Z-pinch plasma confinement region 216 within the plasma generation region 214. One feature of the present teaching is that by using the pulse forming and power delivery section 218 to drive and contain the plasma in the Z-pinch plasma confinement region 216, the source 200 operates without the use of electrodes that are commonly used to conduct discharge current to the plasma in known systems.

There are numerous advantages to the method and apparatus of direct feed gas injection in the plasma confinement regions of light sources according to the present teaching. First, direct feed gas injection under proper flow rates eliminates performance limitations of the light source that result from insufficient feed gas molecules being present in the plasma generation area the chamber. In addition, direct feed gas injection more efficiently uses the feed gas because unused gas does not flow directly from the feed gas inlet 204 to the vacuum pump 206 without passing through the plasma generating region. The direct injection significantly reduces the operational costs of the light source as overall significantly less feed gas is required to achieve the same operating conditions as known EUV light sources. This is especially beneficial for an expensive target gas like Xe.

In addition, another feature of the present teaching is the realization that the direct injection of the feed gas reduces self-absorption of EUV light generated in plasma confinement region 214 as a result of the pressure differential between the plasma generating region and the other regions of the chamber. The following example is useful to illustrate this feature. Assuming the desired operating pressure for the plasma generating region 214 is 100 mTorr, the pressure in the plasma generating region 214 in known EUV light sources has to be at least 100 mTorr. Consequently, to reach 100 mTorr in the plasma generating region 214 without direct injection, the pressure proximate to the plasma generating region 214 would likely need to be more than 100 mTorr because of flow restrictions to the plasma generating region and because of the presence of higher conductance proximate to the plasma generating region 214. The resulting pressure differential between the plasma generating region 214 and the surrounding area reduces the amount of light generated by the light source through self-absorption.

In contrast, directly feeding gas at a pressure of 100 mTorr into the plasma generating region may be achieved without requiring the rest of the system being at the same pressure. A significantly lower pressure, for example 50 mTorr, can be sufficient. In this example, the adjacent chamber pressure may be less than 5 mTorr. Thus, with these pressures, the loss by self-absorption would be significantly reduced.

In addition, another feature of the present teaching is that the plasma generating region will have less contamination because the predominant material flow is from the plasma generating region towards the area surrounding the plasma generating region. This is in contrast to known EUV light sources where gas flows from the surrounding areas into the plasma generating regions. In the typical configuration without the direct feeding gas of the present teaching, the material entering the plasma generating region may be a mix of the target gas and contamination. Such prior art methods will transport contamination from the sounding areas into the plasma generating regions.

Figure 3:
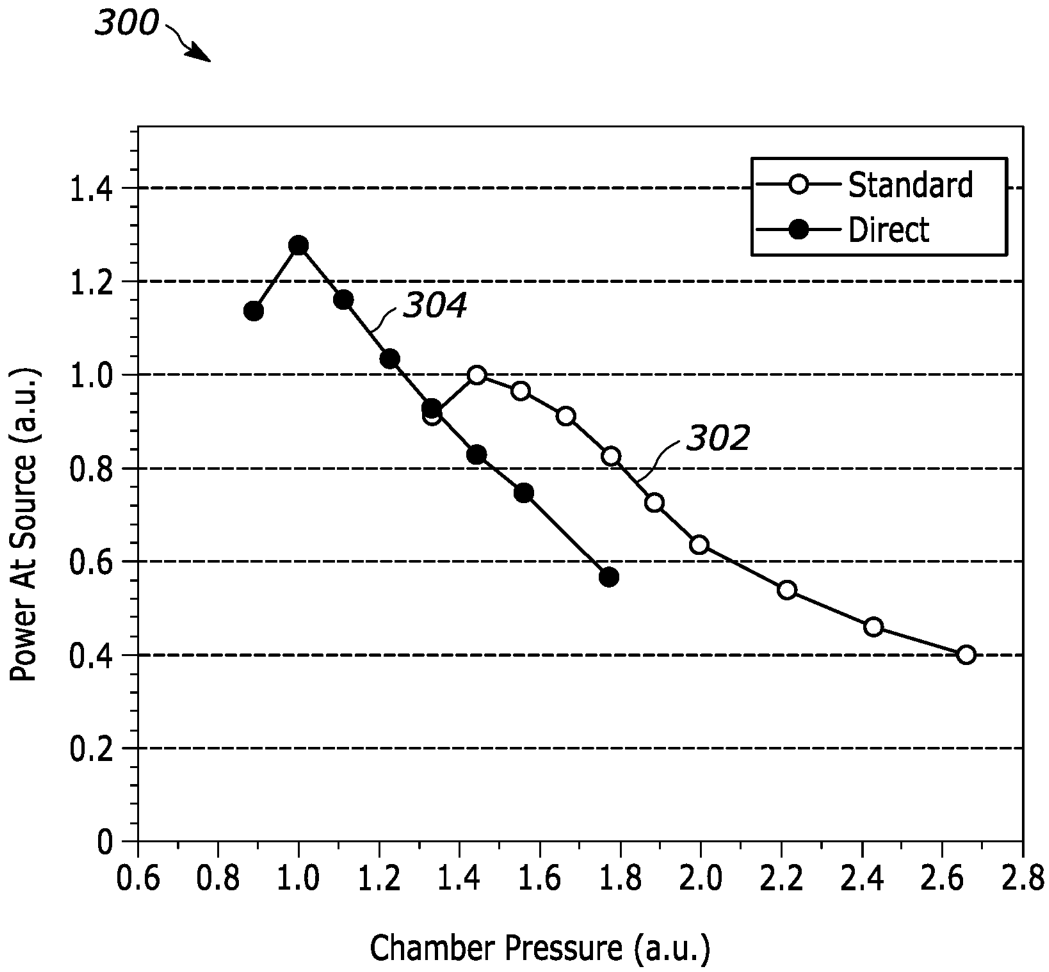
FIG. 3 illustrates graphs of experimental data for the total output optical power generated by a known EUV light source as a function of pressure in the plasma confinement compared with experimental data for total output optical power generated by an EUV light source as a function of pressure in the plasma confinement that includes direct gas injection into the plasma generating region according to the present teaching.

FIG. 3 illustrates graphs 300 of experimental data for the total output optical power generated by a known EUV light source as a function of pressure in the plasma confinement compared with experimental data for total output optical power generated by an EUV light source as a function of pressure in the plasma confinement that includes direct gas injection into the plasma generating region according to the present teaching. The output optical powers are measured at the source output. The pressure is measured at an area surrounding the plasma generating region. The data was taken with the same chamber configuration, geometry, and with the sources operating under the same parameters.

More specifically, the graph 302 illustrates total output optical power generated by a known EUV light source as a function of pressure in the plasma confinement region where a Z-pinch is generated. Graph 304 illustrates total output optical power generated by an EUV light source that includes direct gas injection into the plasma generating region as a function of pressure in the plasma confinement region where a Z-pinch is generated. The data from graphs 302 and 304 illustrate that the optical power generated by the EUV light sources of the present teaching is approximately 28% higher than the optical power generated by known systems with the same chamber configuration, geometry, and with the light sources operating under the same parameters. In addition, the data from graphs 302 and 304 illustrate that the EUV light source according to the present teaching that includes direct gas injection into the plasma generation region has the highest power output at lower pressures in the area surrounding the plasma generating region. This is advantageous because lower pressures reduce loss of light from self-absorption.

Figure 4:
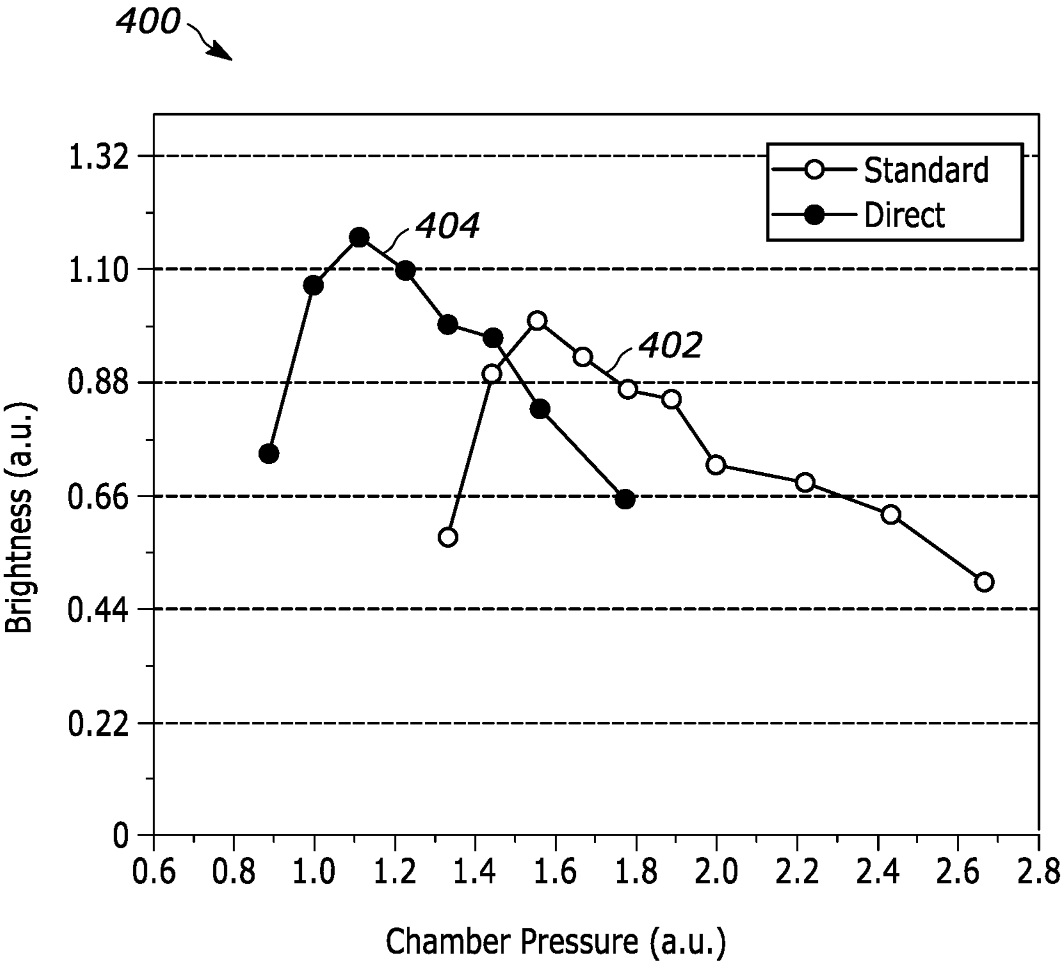
FIG. 4 illustrates graphs of experimental data for the optical brightness of light generated by a known EUV light source as a function of pressure in the plasma confinement region compared with experimental data for optical brightness of light generated by an EUV light source as a function of pressure in the plasma confinement region that includes direct gas injection into the plasma generating region according to the present teaching.

FIG. 4 illustrates graphs 400 of experimental data for the optical brightness of light generated by a known EUV light source as a function of pressure in the plasma confinement region compared with experimental data for optical brightness of light generated by an EUV light source as a function of pressure in the plasma confinement region that includes direct gas injection into the plasma generating region according to the present teaching. The output optical powers are measured at the source output. The pressure is measured at an area surrounding the plasma generating region. The data was taken with the same chamber configuration, geometry, and with the sources operating under the same parameters.

More specifically, the graph 402 illustrates optical brightness generated by a known EUV light source as a function of pressure in the plasma confinement region where a Z-pinch is generated. Graph 404 illustrates optical brightness generated by an EUV light source that includes direct gas injection into the plasma generating region as a function of pressure in the plasma confinement region where a Z-pinch is generated. The data from graphs 402 and 404 illustrate that the optical brightness generated by the EUV light sources of the present teaching is approximately 11% higher than the brightness generated by known system with the same chamber configuration, geometry, and with the light sources operating under the same parameters. In addition, the data from graphs 402 and 404 illustrate that the EUV light source according to the present teaching that includes direct gas injection into the plasma generation region has higher and maximum brightness at lower pressures. This is also advantageous because lower pressures reduce loss of light from self-absorption.

Figure 5:
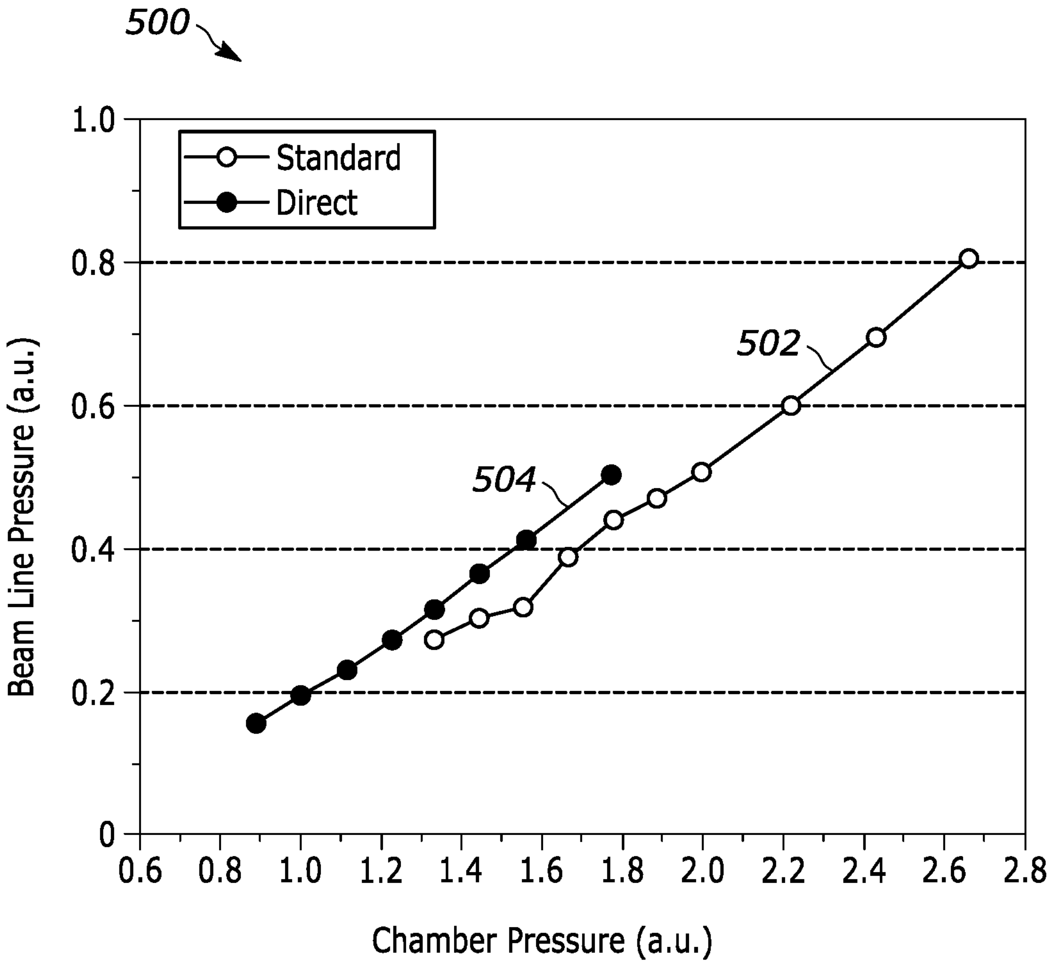
FIG. 5 illustrates graphs of experimental data for beam line pressure as a function of pressure in the plasma confinement of a known EUV light source compared with experimental data for beam line pressure as a function of pressure in the plasma confinement for an EUV light source that includes direct gas injection into the plasma generating region according to the present teaching.

FIG. 5 illustrates graphs 500 of experimental data for beam line pressure as a function of pressure in the plasma confinement of a known EUV light source compared with experimental data for beam line pressure as a function of pressure in the plasma confinement for an EUV light source that includes direct gas injection into the plasma generating region according to the present teaching. The beam line pressure is the pressure in an attached system that couples the light generated by the EUV light source into system for some particular application.

More specifically, the graph 502 illustrates experimental data for beam line pressure as a function of pressure in the plasma confinement of a known EUV light source. The graph 504 illustrates experimental data for beam line pressure as a function of pressure in the plasma confinement for an EUV light source that includes direct gas injection into the plasma generating region according to the present teaching. The data from graphs 502 and 504 illustrate that beam line pressure as a function of pressure in the plasma confinement for an EUV light source that includes direct gas injection into the plasma generating region according to the present teaching is lower for all operating conditions observed for the EUV light source that includes direct gas injection into the plasma generating region according to the present teaching. This is advantageous because attached application system needs to maintain a low pressure since gas in the application system absorbs some of the light generated by the source.

Figure 6:
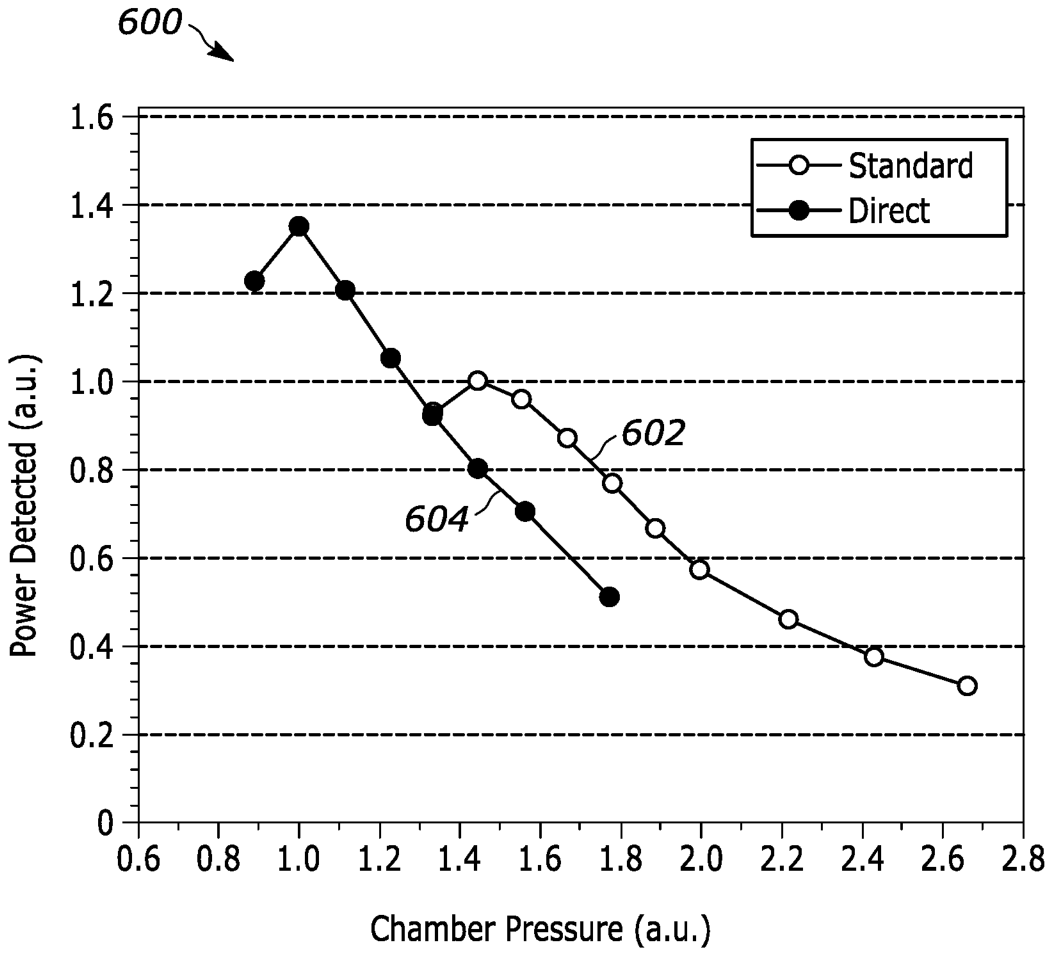
FIG. 6 illustrates graphs of experimental data for detected optical power as a function of pressure in the plasma confinement for a known EUV light source compared with experimental data for detected optical power as a function of pressure in the plasma confinement for an EUV light source that includes direct gas injection into the plasma generating region according to the present teaching.

FIG. 6 illustrates graphs 600 of experimental data for detected optical power as a function of pressure in the plasma confinement for a known EUV light source compared with experimental data for detected optical power as a function of pressure in the plasma confinement for an EUV light source that includes direct gas injection into the plasma generating region according to the present teaching. The output optical powers are measured at the detector position. The pressure is measured at an area surrounding the plasma generating region. The data was taken with the same chamber configuration, geometry, and with the sources operating under the same parameters.

More specifically, the graph 602 illustrates experimental data for detected optical power as a function of pressure in the plasma confinement for a known EUV light source. The graph 604 illustrates experimental data for detected optical power as a function of pressure in the plasma confinement for an EUV light source that includes direct gas injection into the plasma generating region according to the present teaching. The data in graph 604 corresponding to the EUV light sources that includes direct gas injection into the plasma generating region according to the present teaching shows the effect of the reduced self-absorption in the attached application system from the power measured at the detector location.

In particular, the data in graph 604 shows that by providing the feed gas directly to the plasma generating region there is an approximately 35% higher light output detected than with known systems with the same chamber configuration, geometry, and with the sources operating under the same parameters. With EUV light sources according to the present teaching, the target gas is delivered more efficiently to the plasma generation region at higher pressures so the source can be operated at a higher repetition rate, which results in increased EUV output Thus, an important feature of the EUV light sources with direct gas injection according to the present teaching is that such light sources shift the operating optimum performance point towards lower pressure ranges in the plasma confinement region. This shift towards lower pressure in the plasmas confinement regions results in a reduction of pressure in the application system as well as reduced optical absorption.

The following example is helpful in illustrating performance that can be achieved with an EUV light source with direct gas feeding according to the present teaching. Referring back to FIG. 2, experiments have determined that the source 200 can be configured and operated with operating conditions that produce about twenty Watts of 13.5-nm-wavelength EUV radiation in 2-pi steradians with a brightness of eight W/mm$^2$-sr. The pulse rate of the source was adjustable. For example, the pulse rate was 2.5 kHz in some experiments recording these data. Under these conditions, the plasma confinement region 214 was less than 1 mm in diameter and was even made to be less than 0.5 mm in diameter by changing some operating conditions. In some methods of operation, the actual position of the plasma confinement region 214 was made to vary by less than a few microns pulse-to-pulse.

These data in the experimental results indicate that EUV sources that use direct gas feeding according to the present teaching are useful for wide array of test and measurement systems. The EUV source with direct gas injection according to the present teaching can provide highly flexible access to the EUV radiation generated by the plasma that results in many more possible application configurations than known EUV systems because of the lower pressure operation. Also, the EUV source with direct gas injection according to the present teaching can provide highly flexible access to the EUV radiation generated by the plasma that results in many more possible application configurations than known EUV systems also because of the resulting reduced self-absorption. In addition, the EUV source with direct gas injection according to the present teaching can provide highly flexible access to the EUV radiation generated by the plasma that results in many more possible application configurations than known EUV systems because of the wider range of operation conditions. Furthermore, the EUV source with direct gas injection according to the present teaching can provide highly flexible access to the EUV radiation generated by the plasma that results in many more possible application configurations than known EUV systems also because it provides more flexibility over the size and shape of the Z-pinched plasma.

Thus, an EUV light source according to the present teaching provides numerous performance advantages by providing a gas feed directly to the plasma generation region so that gas does not need to migrate into the plasma generating region from the vacuum chamber. This feature is desirable especially when an increase in total delivered EUV output requires a pulse rate that is on order of 2,500 Hz. Under these and similar conditions, the slow refeeding of the plasma generating region leads to a performance decrease in known EUV light sources. With direct gas feeding, since the feed gas is forced directly through the plasma generating region, the feed gas does not have to migrate there, and a re-filling of the plasma generating region is faster and more efficient. This allows an operation of the plasma light source at repetition rates exceeding what can be achieved if direct gas feeding is not used. Additional benefits are reduced self-absorption and higher gas utilization, and the ability to introduce different gas species at a plurality of different locations.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. An ultraviolet light source with direct feed gas injection, the light source comprising:

a) a chamber comprising a plasma confinement region and defining an aperture adjacent to the plasma confinement region that passes light generated by the plasma;

b) a magnetic core positioned around the plasma confinement region and configured to generate a plurality of plasma current loops that converges in the plasma confinement region during operation;

c) a first feed gas injector coupled to a gas port in the chamber and having an output positioned proximate to a boundary of the plasma confinement region, the first feed gas injector providing a feed gas to the plasma confinement region that creates a differential pressure in the plasma confinement region;

d) a second gas injection port configured to inject gas into the chamber at a location that provides a desired amount of back flow of gas into the plasma confinement region after formation of a pinch expansion in the plasma confinement region;

e) a high voltage region coupled to the plasma confinement region; and f) an exhaust port that is configured to be coupled to a pump that controls a pressure in the chamber.

2. The light source of claim 1 wherein the output of the feed gas injector is positioned within 1 cm of the boundary of the plasma confinement region.

3. The light source of claim 1 wherein the output of the feed gas injector is positioned within ½ cm of the boundary of the plasma confinement region.

4. The light source of claim 1 wherein the output of the feed gas injector is positioned between a low voltage region and the high voltage region of the chamber.

5. The light source of claim 1 wherein the feed gas injector comprises a gas tube having an output that is positioned proximate to the boundary of the plasma confinement region.

6. The light source of claim 1 wherein the feed gas injector is formed in the chamber.

7. The light source of claim 1 wherein the feed gas injector comprises a plurality of apertures that provide the feed gas into plasma confinement region.

8. The light source of claim 1 wherein the feed gas injector is positioned so that substantially all feed gas flows through the plasma confinement region before passing into the exhaust port.

9. The light source of claim 1 wherein the feed gas injector is positioned and configured so that a desired ratio of pressure in the plasma confinement region to pressure in the chamber proximate to the exhaust port is maintained during operation.

10. The light source of claim 1 wherein the second gas injection port is positioned proximate to the high voltage region.

11. The light source of claim 1 wherein the second gas injection port is positioned proximate to a low voltage portion of the chamber.

12. The light source of claim 1 wherein the second gas injection port is configured to introduce a second type of feed gas.

13. The light source of claim 1 wherein the second gas injection port comprises an output that is positioned proximate to a second boundary of the plasma confinement region.

14. The light source of claim 1 further comprising a second feed gas injector coupled to the second gas injection port and having an output positioned in the second boundary of the plasma confinement region.

15. The light source of claim 1 wherein the second gas injection port is positioned to inject gas into the chamber so as to reduce self-absorption of the feed gas outside of the plasma confinement region.

16. The light source of claim 1 wherein the feed gas injector comprises a pulsed gas injector configured to inject gas into the plasma confinement region at times that refill the plasma confinement region after pinch expansion.

17. A method of generating ultraviolet light, the method comprising:

a) providing a chamber that defines a plasma confinement region therein, the chamber defining a port that passes plasma generated light out of the chamber, a high voltage region coupled to the plasma confinement region, and an exhaust port that is configured to be coupled to a vacuum pump that controls a pressure in the chamber;

b) directly injecting a feed gas into a boundary of the plasma confinement region;

c) providing voltage to the high voltage region, thereby generating a plasma;

d) controlling a pressure in the plasma confinement region relative to the chamber so as to provide a desired pressure differential; and e) adjusting a flow of the feed gas injected into the chamber so as to provide a desired amount of back flow of gas into the plasma confinement region after formation of a pinch expansion in the plasma confinement region.

18. The method of claim 17 wherein the controlling the pressure in the plasma confinement region relative to the chamber comprises controlling a flow of the feed gas with a mass flow controller.

19. The method of claim 17 further comprising injecting a feed gas in the chamber.

20. The method of claim 19 wherein the feed gas injected into the chamber is injected proximate to the high voltage region.

21. The method of claim 19 wherein the feed gas injected into the chamber is injected proximate to a low voltage region.

22. The method of claim 17 further comprising injecting a second feed gas directly into a second boundary of the plasma confinement region.

23. The method of claim 17 wherein the directly injecting the feed gas into the boundary of the plasma confinement region comprises injecting the feed gas through a tube having an output positioned inside of the boundary of the plasma confinement region.

24. The method of claim 17 wherein the directly injecting the feed gas into the boundary of the plasma confinement region comprises injecting the feed gas in a plurality of locations inside of the boundary of the plasma confinement region.

25. The method of claim 19 further comprising configuring the chamber so that substantially all the feed gas flows through the plasma confinement region before passing into the exhaust port.

26. The method of claim 17 further comprising pumping the chamber through an exhaust port to provide a desired ratio of pressure in the plasma confinement region to pressure in the chamber proximate to the exhaust port.

27. The method of claim 17 further comprising adjusting a flow of the feed gas directly injected into the boundary of the plasma confinement region so as to provide a desired ratio of pressure in the plasma confinement region to pressure in the chamber proximate to an exhaust port.

28. The method of claim 17 wherein the directly injecting the feed gas into the boundary of the plasma confinement region comprises injecting gas into the plasma confinement region at times that refill the plasma confinement region after pinch expansion.

29. The method of claim 17 wherein the directly injecting the feed gas into the boundary of the plasma confinement region comprises injecting the feed gas at a flow rate that reduces self-absorption of the feed gas outside of the plasma confinement region.

* * * * *